(12) United States Patent
Higashi

(10) Patent No.: US 11,626,333 B2
(45) Date of Patent: Apr. 11, 2023

(54) SEMICONDUCTOR DEVICE

(71) Applicant: Fuji Electric Co., Ltd., Kanagawa (JP)

(72) Inventor: Nobuhiro Higashi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 26 days.

(21) Appl. No.: 17/220,461

(22) Filed: Apr. 1, 2021

(65) Prior Publication Data

US 2021/0366796 A1 Nov. 25, 2021

(30) Foreign Application Priority Data

May 22, 2020 (JP) .............................. JP2020-090098

(51) Int. Cl.
*H01L 23/049* (2006.01)
*H01L 25/18* (2006.01)
(Continued)

(52) U.S. Cl.
CPC ............ *H01L 23/049* (2013.01); *H01L 23/08* (2013.01); *H01L 23/295* (2013.01); *H01L 23/3735* (2013.01); *H01L 24/32* (2013.01); *H01L 24/48* (2013.01); *H01L 24/73* (2013.01); *H01L 25/072* (2013.01); *H01L 25/18* (2013.01); *H01L 2224/32225* (2013.01); *H01L 2224/48137* (2013.01); *H01L 2224/48175* (2013.01); *H01L 2224/73265* (2013.01); *H01L 2924/1033* (2013.01); *H01L 2924/10253* (2013.01); *H01L 2924/10272* (2013.01); *H01L 2924/12031* (2013.01); *H01L 2924/12032* (2013.01);
(Continued)

(58) Field of Classification Search
CPC ..... H01L 23/049; H01L 23/08; H01L 23/295; H01L 23/3735; H01L 24/32; H01L 24/48; H01L 24/73; H01L 25/072; H01L 2224/32225; H01L 2224/48137; H01L 2224/73265; H01L 2924/17791; H01L 2924/351
See application file for complete search history.

(56) References Cited

U.S. PATENT DOCUMENTS

2006/0138532 A1* 6/2006 Okamoto ................ H01L 24/37
257/E23.044
2016/0379912 A1 12/2016 Komatsu
2020/0194324 A1 6/2020 Sasaki et al.

FOREIGN PATENT DOCUMENTS

JP H6-85126 A 3/1994
JP H10-270609 A 10/1998
(Continued)

*Primary Examiner* — Jasmine J Clark
(74) *Attorney, Agent, or Firm* — Chen Yoshimura LLP

(57) ABSTRACT

A semiconductor device includes: a semiconductor chip; a case having a frame portion that has an inner wall portion surrounding an housing area in which the semiconductor chip is disposed; a buffer member provided on at last part of the inner wall portion of the case on a side of the housing area; a low expansion member provided on said at least part of the inner wall portion with the buffer member interposed therebetween on the side of the housing area; and a sealing member that seals the housing area, wherein the buffer member has a smaller elastic modulus than the case and the sealing member, and wherein the low expansion member has a smaller linear expansion coefficient than the case and the sealing member.

16 Claims, 13 Drawing Sheets

(51) Int. Cl.
  *H01L 23/00*    (2006.01)
  *H01L 23/08*    (2006.01)
  *H01L 23/29*    (2006.01)
  *H01L 23/373*   (2006.01)
  *H01L 25/07*    (2006.01)

(52) U.S. Cl.
  CPC ............ *H01L 2924/13055* (2013.01); *H01L 2924/13091* (2013.01); *H01L 2924/1579* (2013.01); *H01L 2924/15787* (2013.01); *H01L 2924/17791* (2013.01); *H01L 2924/351* (2013.01)

(56) References Cited

FOREIGN PATENT DOCUMENTS

| | | | | |
|---|---|---|---|---|
| JP | 2013-016684 | A | | 1/2013 |
| JP | 2017-17109 | A | | 1/2017 |
| JP | 2021111700 | A * | 8/2021 | ............ H01L 23/29 |
| WO | 2019/038906 | A1 | | 11/2019 |

\* cited by examiner

SEMICONDUCTOR DEVICE

BACKGROUND OF THE INVENTION

Technical Field

The present invention relates to a semiconductor device.

Background Art

A semiconductor device that includes a power device may be used as a power conversion device. A power devices includes one or more of semiconductor chips. The semiconductor chip is, for example, an IGBT (Insulated Gate Bipolar Transistor) or a power MOSFET (Metal Oxide Semiconductor Field Effect Transistor). Such a semiconductor device includes at least a semiconductor chip, a ceramic circuit board on which the semiconductor chip is arranged, and a heat dissipation plate on which the ceramic circuit board is arranged. The ceramic circuit board includes an insulating plate and circuit patterns arranged on the insulating plate. Further, the semiconductor device includes a case for accommodating the semiconductor chip and a sealing member for sealing the inside of the case. The case is arranged on the heat radiating plate and surrounds the ceramic circuit board on which the semiconductor chip is arranged. In addition, the case is integrally molded with external connection terminals. The external connection terminals are electrically connected to the ceramic circuit board and the semiconductor chip in the case.

RELATED ART DOCUMENT

Patent Document

Patent Document 1: Japanese Patent Application Laid-Open Publication No. 2017-17109

SUMMARY OF THE INVENTION

Different resins are used for the case and the sealing member included in the above semiconductor device, and the linear expansion coefficient is therefore different between the case and the sealing member. Therefore, an internal stress is generated in the semiconductor device as the temperature changes. Then, peeling occurs between the internal components of the semiconductor device. As a result, the power cycle endurance of the semiconductor device is lowered. Therefore, the reliability of the semiconductor device with respect to the temperature change is lowered.

The present invention has been made in view of these points, and an object of the present invention is to provide a semiconductor device capable of mitigating internal stress due to temperature changes.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device including: a semiconductor chip; a case having a frame portion that has an inner wall portion surrounding an housing area housing the semiconductor chip; a buffer member provided on at last part of the inner wall portion of the case on a side of the housing area; a low expansion member provided on said at least part of the inner wall portion with the buffer member interposed therebetween on the side of the housing area; and a sealing member that seals the housing area, wherein the buffer member has a smaller elastic modulus than the case and the sealing member, and wherein the low expansion member has a smaller linear expansion coefficient than the case and the sealing member.

The semiconductor device having the above configuration mitigates internal stress due to temperature changes and prevents a decrease in reliability due to temperature changes.

It is to be understood that both the foregoing general description and the following detailed description are exemplary and explanatory, and are intended to provide further explanation of the invention as claimed.

DETAILED DESCRIPTION OF EMBODIMENTS

Hereinafter, embodiments will be described with reference to the drawings. In these present embodiments, the front surface (upper side surface) represents the surface (direction) in which the semiconductor device 10 of FIG. 1 faces upward. For example, in the insulating circuit board 12, the surface on which the semiconductor chips 13a and 13b are mounted (mounted side) is the front surface (upper side). The back surface (lower side) represents a surface (direction) facing downward in the semiconductor device 10 of FIG. 1. For example, in the insulating circuit board 12, the surface (mounted side) to which the heat radiating plate 14 is joined is the back surface (lower side). In other drawings, the front surface (upper side) and the back surface (lower side) have the same meanings as those, respectively.

The First Embodiment

Figure 1:
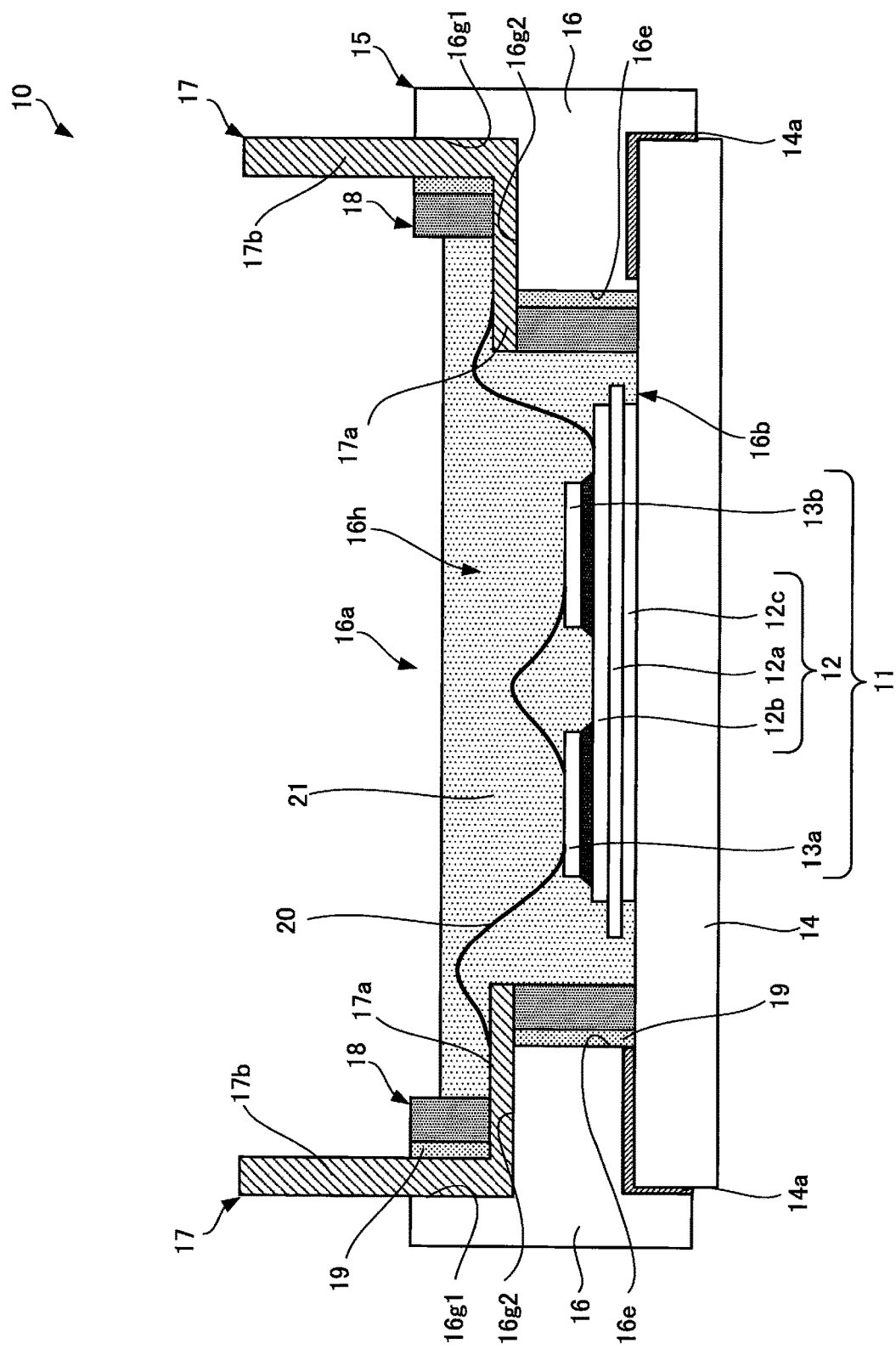
FIG. 1 is a cross-sectional view of the semiconductor device of a first embodiment.
Figure 2:
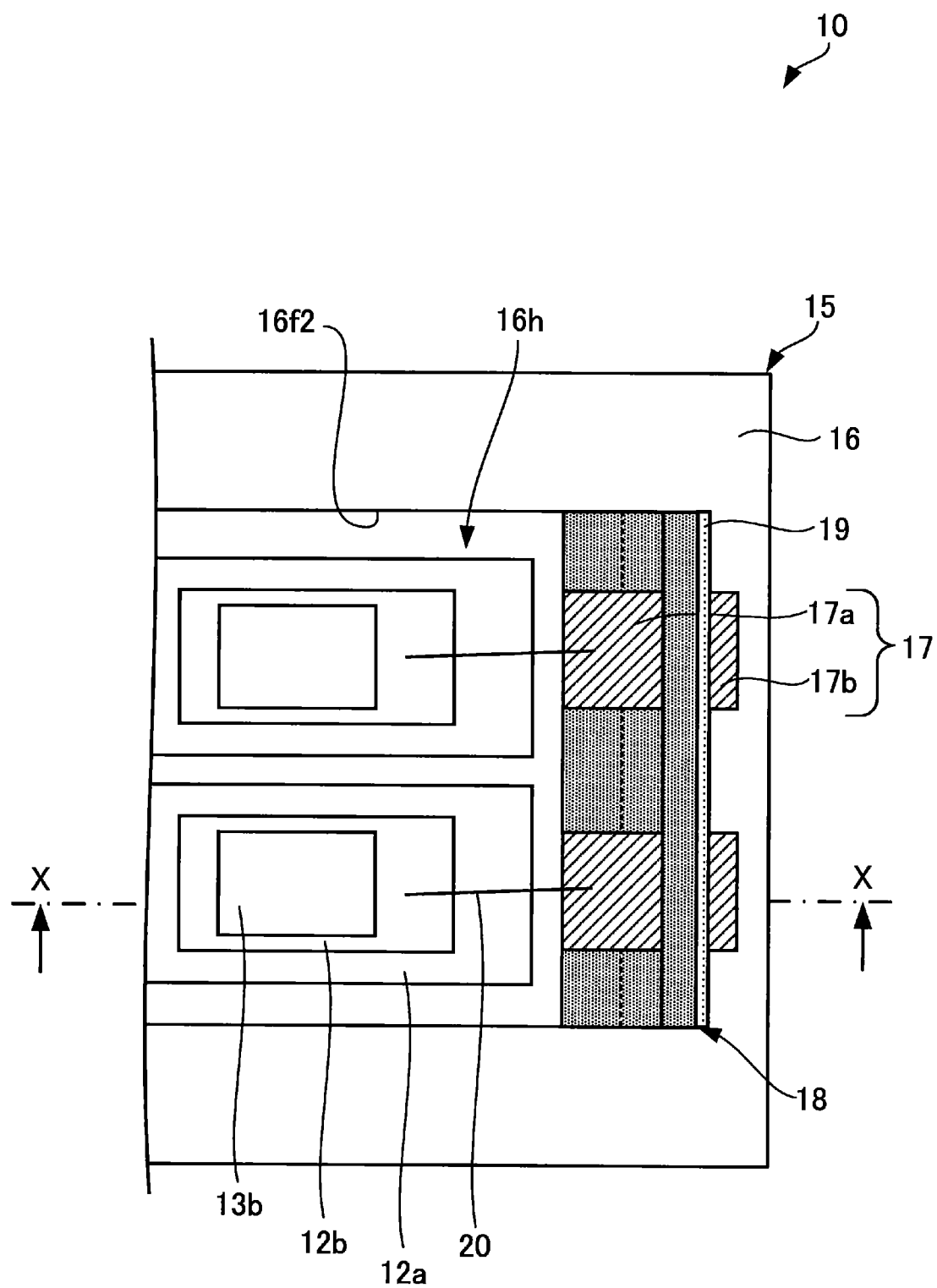
FIG. 2 is a main part plan view of the semiconductor device of the first embodiment.

A semiconductor device of a first embodiment will be described with reference to FIGS. 1 and 2. FIG. 1 is a cross-sectional view of the semiconductor device according to the first embodiment. FIG. 2 is a plan view of a main part of the semiconductor device according to the first embodiment. Note that FIG. 1 is a cross-sectional view at a portion corresponding to the alternate long and short dash line X-X of FIG. 2. FIG. 2 is a plan view of a main part on the right side of the semiconductor device 10 of FIG. 1. Further, in FIG. 2, a sealing member 21 is omitted.

As shown in FIGS. 1 and 2, a semiconductor device 10 includes: a semiconductor unit 11; a heat radiation plate 14 having a rectangular shape in a plan view having a front surface on which the semiconductor unit 11 is arranged; a case 15 on the outer periphery of the heat radiation plate 14 for housing the semiconductor unit 11; and a sealing member 21 that seals the inside of the case 15. The semiconductor unit 11 includes an insulating circuit board 12 and semiconductor chips 13a and 13b that arranged on the front surface of the insulating circuit board 12 via a bonding member.

The insulating circuit board 12 includes an insulating plate 12a, a plurality of circuit patterns 12b provided on the front surface of the insulating plate 12a, and a metal plate 12c provided on the back surface of the insulating plate 12a. The insulating plate 12a and the metal plate 12c have a rectangular shape in a plan view. Further, the corners of the insulating plate 12a and the metal plate 12c may be chamfered into an R shape or a C shape. The size of the metal plate 12c is smaller than the size of the insulating plate 12a in a plan view, and the metal plate 12c is formed on inner sides of the insulating plate 12a. The insulating plate 12a is made of a material having insulating properties, low thermal resistance, and excellent thermal conductivity. Such an insulating plate 12a is made of ceramics or an insulating resin. The ceramics are aluminum oxide, aluminum nitride, silicon nitride and the like. The insulating resin is a paper phenol substrate, a paper epoxy substrate, a glass composite substrate, a glass epoxy substrate, or the like. The thickness of such an insulating plate 12a is 0.2 mm or more and 2.5 mm or less.

The plurality of circuit patterns 12b are made of a material having excellent conductivity. Such a material is, for example, copper, aluminum, or an alloy containing at least one of these. The thickness of the circuit pattern 12b is preferably 0.10 mm or more and 2.00 mm or less, and more preferably 0.20 mm or more and 1.00 mm or less. It is also possible to perform a plating treatment on the circuit pattern 12b with a material having excellent corrosion resistance. Such a material is, for example, nickel, an alloy containing nickel, or the like. Other than nickel, nickel-phosphorus alloys, nickel-boron alloys, and the like may be used. The thickness of the plating film is preferably 1 µm or more, more preferably 5 µm or more. The number, arrangement position, and shape of the circuit patterns 12b shown in FIGS. 1 and 2 are merely examples, and are not limited to this; the number, arrangement position, and shape can be appropriately selected as needed.

The metal plate 12c is made of a metal having excellent thermal conductivity. Such a material is made of, for example, copper, aluminum, or an alloy containing at least one of these. The thickness of the metal plate 12c is preferably 0.10 mm or more and 2.00 mm or less, and more preferably 0.20 mm or more and 1.00 mm or less. Further, in order to improve the corrosion resistance, for example, a material such as nickel may be formed on the surface of the metal plate 12c by plating or the like. Other than nickel, nickel-phosphorus alloys, nickel-boron alloys and the like may be used. The thickness of the plating film is preferably 1 µm or more, more preferably 5 µm or more.

Such an insulated circuit board 12 is formed, for example, as follows. First, the metal plate 12c, the insulating plate 12a, and a conductive plate including the plurality of circuit patterns 12b are laminated in this order, and they are pressure-bonded by heating and pressurizing in the stacking direction. Such pressure-bonding is performed in an activating gas atmosphere or in vacuum. After that, the plurality of circuit patterns 12b are formed by masking the conductive plate with a photosensitive resist mask in accordance with prescribed patterns, etching the masked conductive plate, and then by removing the photosensitive resist.

The semiconductor chips 13a and 13b are power devices composed of silicon, silicon carbide or gallium nitride. The semiconductor chip 13a includes a switching element. The switching element is a power MOSFET, an IGBT, or the like. In such a semiconductor chip 13a, for example, a drain electrode (positive electrode, a collector electrode in an IGBT) is provided on the back surface as a main electrode, and a gate electrode (control electrode) and a source electrode (negative electrode, an emitter electrode in the case of the IGBT) are provided on the front surface as main electrodes. Further, the semiconductor chip 13b includes a diode element. The diode element is an FWD (Free Wheeling Diode), such as an SBD (Schottky Barrier Diode) or a PiN (P-intrinsic-N) diode. Such a semiconductor chip 13b has a cathode electrode as a main electrode on the back surface and an anode electrode as a main electrode on the front surface. The back surfaces of the semiconductor chips 13a and 13b are joined to the predetermined circuit patterns 12b by a bonding member. The bonding member is a solder or a sintered member. The solder is composed of lead-free solder containing a prescribed alloy as a main component. The prescribed alloy is, for example, at least one of an alloy composed of tin-silver-copper, an alloy composed of tin-zinc-bismuth, an alloy composed of tin-copper, and an alloy composed of tin-silver-indium-bismuth. The solder may contain additives such as nickel, germanium, cobalt or silicon. The sintered member for joining by sintering is, for example, a powder of silver, iron, copper, aluminum, titanium, nickel, tungsten, or molybdenum. The thickness of the semiconductor chips 13a and 13b is, for example, 80 µm or more and 500 µm or less, and the average is about 200 µm. If needed, additional electronic components can be arranged on the plurality of circuit patterns 12b. Such electronic components are, for example, capacitors, resistors, thermistors, current sensors, and control ICs (Integrated Circuits). Further, instead of the semiconductor chips 13a and 13b, a semiconductor chip including an RC-IGBT switching element in which an IGBT and an FWD are configured in one chip may be arranged. FIG. 1 shows the case where a pair of semiconductor chips 13a and 13b are arranged on the insulating circuit board 12, but the present invention is not limited to this; a plurality of such pairs may be arranged as needed, for example.

The heat radiating plate 14 has a flat plate shape and a rectangular shape in a plan view. Further, the heat radiating plate 14 may have a rectangular shape wider than the case 15 in a plan view. The heat radiating plate 14 is made of a metal having excellent thermal conductivity. Such materials include, for example, aluminum, iron, silver, copper, or an alloy containing at least one of these. As an example of such an alloy, a metal composite material such as aluminum-silicon nitride (Al—SiC) or magnesium-silicon nitride (Mg—SiC) may be used. In order to improve the corrosion resistance, a material such as nickel may be formed on the surface of the heat radiating plate 14 by plating or the like. Other than nickel, nickel-phosphorus alloys, nickel-boron alloys, and the like may be used. Further, a cooling unit (not shown) can be attached to the back surface of the case 15 that includes the heat radiating plate 14, via a heat conductive member. The heat conductive member is a thermal interface material (TIM). The TIM encompasses various materials such as thermally conductive grease, elastomer sheet, RTV (Room Temperature Vulcanization) rubber, gel, phase change material, solder, and silver wax. With this structure, the heat dissipation of the semiconductor device 10 can be improved. The cooling unit in this case is made of, for example, a metal having excellent thermal conductivity. Such metal is aluminum, iron, silver, copper, or an alloy containing at least one of these. The cooling unit is a heat sink having one or more fins, a water-cooled cooling device, or the like. Further, the heat radiating plate 14 may be integrated with such a cooling unit.

The case 15 includes a frame portion 16 and external connection terminals 17 attached to the frame portion 16. The frame portion 16 has a frame shape that surrounds a rectangular housing area 16h in a plan view. The housing area 16h is an area from the upper opening 16a of the front surface to the lower opening 16b of the back surface of the case 15.

Further, the area of the upper opening 16a may be larger than the area of the lower opening 16b. In this case, the frame portion 16 has a stepped portion 16d formed between the upper opening portion 16a and the lower opening portion 16b at the short sides in a plan view. The inner wall portion 16f1 at the short side in the plan view of the frame portion 16 is formed in a stepped shape by the upper inner wall portion 16c, the step portion 16d, and the lower inner wall portion 16e (see FIGS. 4 and 5, described later). That is, the upper inner wall portion 16c is arranged vertically downward from the front surface of the frame portion 16, the step portion 16d is arranged perpendicularly (horizontally) to the upper inner wall portion 16c, and the lower inner wall portion 16e is arranged downwardly from the step portion 16d. In other words, in a plan view, the lower inner wall portion 16e projects inwardly towards the housing area 16h on the opening side from the upper inner wall portion 16c by the length of the step portion 16d. Further, on the long side of the frame portion 16 in a plan view, the inner wall portion 16f2 is arranged vertically downward from the front surface of the frame portion 16. Therefore, the upper opening 16a and the lower opening 16b are surrounded by the inner wall portions 16f1 on the short sides and the inner wall portions 16f2 on the long sides, respectively. In some embodiments, alternatively, the inner wall portion 16f1 on the short side may be arranged vertically downward from the front surface of the frame portion 16 without a stepped shape, depending on the design of the semiconductor device 10.

Figure 4:
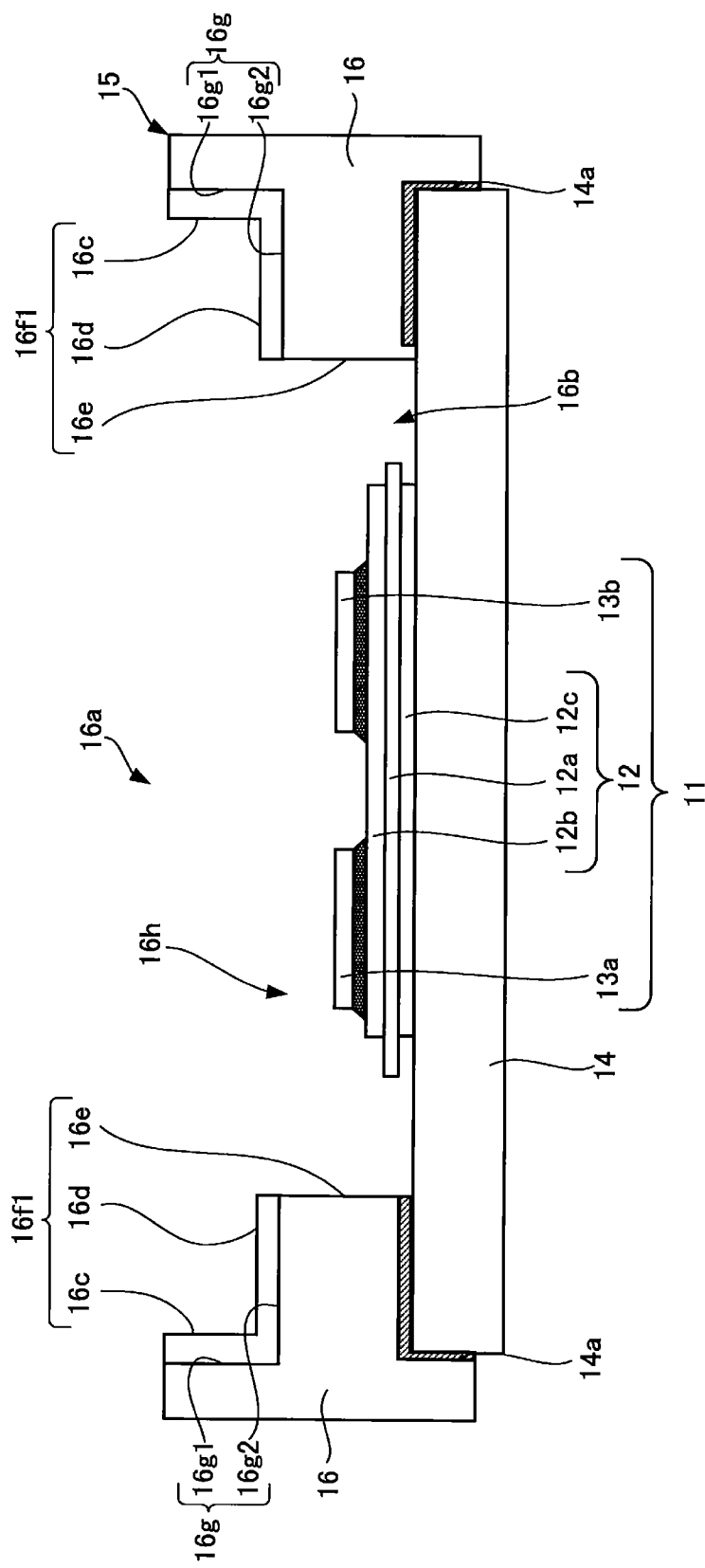
FIG. 4 shows a state after the case attachment process is performed in the manufacturing method of the semiconductor device of the first embodiment.
Figure 5:
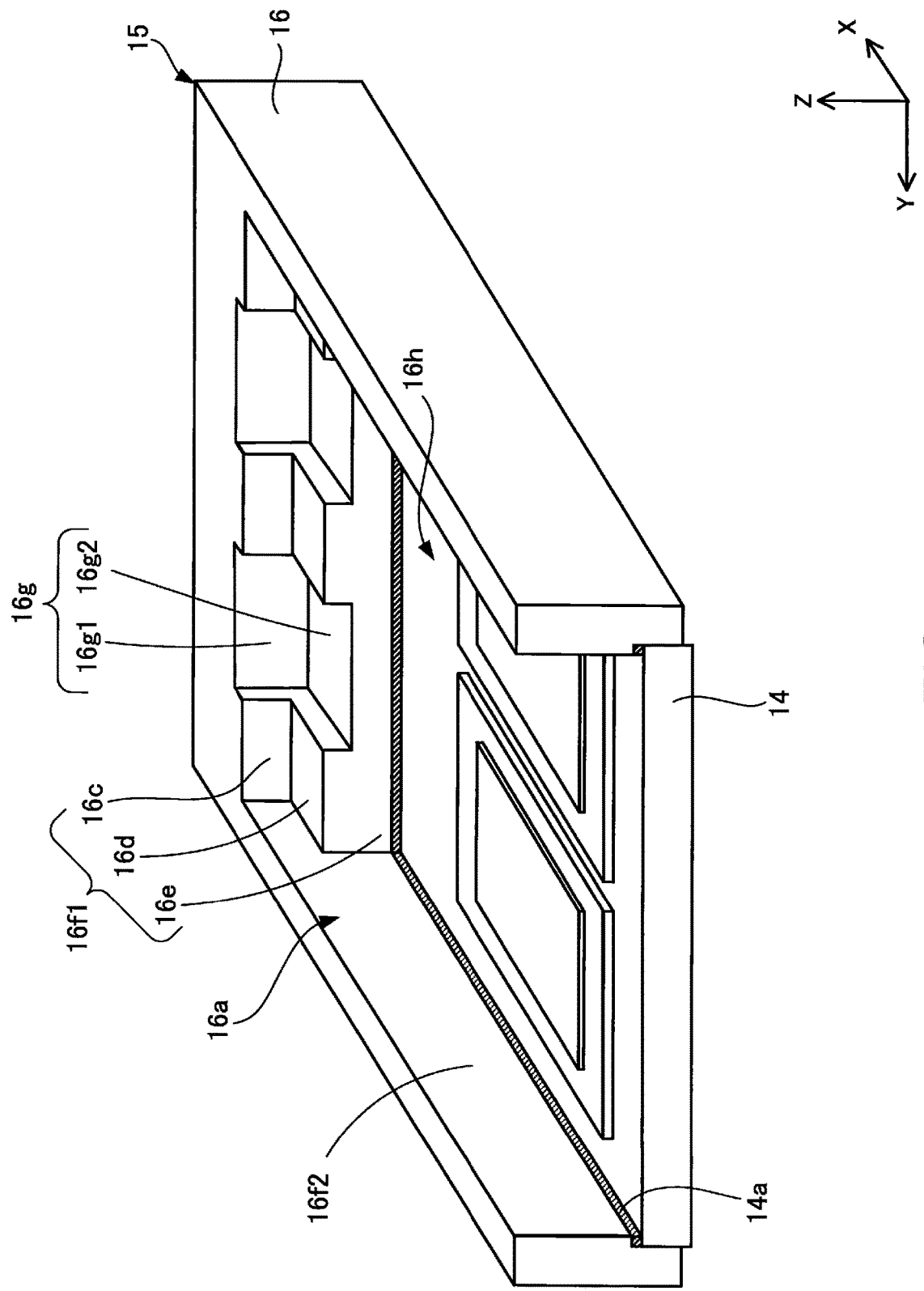
FIG. 5 shows the state after the case mounting process is performed in the manufacturing method of the semiconductor device of the first embodiment.

Further, in the frame portion 16, a terminal groove(s) 16g is formed in the inner wall portion 16f1 at the short side (see FIGS. 4 and 5 described later). When the inner wall portion 16f1 of the frame portion 16 is stepped, the terminal groove 16g includes a groove inner wall portion 16g1 and a groove step portion 16g2. The groove inner wall portion 16g1 is formed of a shape of a recess on the upper inner wall portion 16c of the inner wall portion 16f1 extending from the front surface of the frame portion 16 to the step portion 16d. The groove step portion 16g2 is formed of a shape of a recess on the step portion 16d of the inner wall portion 16f1 extending from the upper inner wall portion 16c to the lower inner wall portion 16e and is orthogonal to the groove inner wall portion 16g1 (see FIG. 6 described later). Further, the inner wall portion 16f2 at the long side in a plan view is arranged vertically downward with respect to the front surface of the frame portion 16. Therefore, the upper opening portion 16a is surrounded by the upper inner wall portions 16c on the short sides and the inner wall portions 16f2 on the long sides. The lower opening 16b is surrounded by the lower inner wall portions 16e on the short sides and the inner wall portions 16f2 on the long sides. Further, the housing area 16h is surrounded by the upper inner wall portions 16c, the lower inner wall portions 16e, and the inner wall portions 16f2 on the long sides.

Such a frame portion 16 is formed by injection molding using a thermoplastic resin containing a filler. The elastic modulus of such a material is 3 GPa or more and 25 GPa or less. The coefficient of linear expansion is $7\times10^{-6}$/K or more and $100\times10^{-6}$/K or less. Examples of such resins include polyphenylene sulfide (PPS) resin, polybutylene terephthalate (PBT) resin, and polyamide (PA) resin. Examples of the filler include glass fiber, glass beads, calcium carbide, talc, magnesium oxide, aluminum hydroxide and the like. In particular, in this embodiment, the frame portion 16 uses a PPS resin containing any of these fillers.

The external connection terminal 17 has a flat plate shape, is L-shaped, and is arranged in the terminal groove 16g of the frame portion 16. The external connection terminal 17 includes an internal wiring portion 17a and an external wiring portion 17b provided vertically with respect to the internal wiring portion 17a. That is, the internal wiring portion 17a is arranged parallel to the front surface of the case 15, and the external wiring portion 17b is arranged parallel to the side surface of the case 15. The internal wiring portion 17a is provided in the groove step portion 16g2 of the terminal groove 16g. One end of the internal wiring portion 17a extends from the lower inner wall portion 16e to the housing area 16h side. Further, a bonding region to which a wiring member(s) is bonded is provided on one end side of the internal wiring portion 17a. The external wiring portion 17b is provided on the groove inner wall portion 16g1 of the terminal groove 16g. The top end of the external wiring portion 17b protrudes upward from the front surface of the frame portion 16. The front surface of the internal wiring portion 17a of the external connection terminal 17 arranged in the terminal groove 16g of the frame portion 16 in this way is above the step portion 16d or is flush with the step portion 16d. Further, the surface of the external wiring portion 17b protrudes toward the housing area 16h from the upper inner wall portion 16c, or forms the same plane as the upper inner wall portion 16c. Such an external connection terminal 17 is made of a material having excellent conductivity. Such a material is, for example, copper, aluminum, or an alloy containing at least one of these. The thickness of the external connection terminal 17 is uniform throughout. It is also possible to perform plating treatment on the external connection terminal 17 with a material having excellent corrosion resistance. Such a material is, for example, aluminum, nickel, titanium, chromium, molybdenum, tantalum, niobium, tungsten, vanadium, bismuth, zirconium, hafnium, gold, silver, platinum, palladium, or an alloy containing at least one of these.

In such a frame portion 16 of the case 15, the back surface of the lower opening 16b side and the outer peripheral edge portion of the front surface of the heat radiating plate 14 are joined by an adhesive 14a so as to house the semiconductor unit 11 and the sealing member 21, which will be described later, within the housing area 16h of the frame portion 16. Further, a lid (not shown) may be attached to the front surface of the frame portion 16 on the upper opening 16a side with an adhesive. As the adhesive 14a, for example, a thermosetting resin adhesive or an organic adhesive is used. The thermosetting resin adhesive contains, for example, an epoxy resin or a phenol resin as a main component. The organic adhesive is, for example, an elastomer adhesive containing silicone rubber or chloroprene rubber as a main component.

Then, the bonding region of the internal wiring portion 17a of the external connection terminal 17 of the case 15, the circuit pattern 12b of the insulating circuit board 12, and the semiconductor chips 13a and 13b are electrically connected by wiring members such as bonding wires 20. The bonding wire 20 is made of a material having excellent conductivity. Such a material is composed of, for example, gold, silver, copper, aluminum, or an alloy containing at least one of these. The diameter of the bonding wire 20 is, for example, 110 μm or more and 500 μm or less. The wiring member is not limited to the bonding wire 20, and a lead frame may be used.

The sealing member 21 seals the semiconductor unit 11 arranged in the housing area 16h. The sealing member 21 seals low expansion members 18 to be provided via a buffer member 19, which will be described later, and the inner side (housing area 16h) of the frame portion 16. Such a sealing member 21 is a thermosetting resin mixed with a filler. The elastic modulus of such a material is 3 GPa or more and 25 GPa or less. The coefficient of linear expansion of such a material is $7 \times 10^{-6}$/K or more and $30 \times 10^{-6}$/K or less. The thermosetting resin is, for example, an epoxy resin, a phenol resin, a maleimide resin, or a polyester resin. The filler is a ceramic that is insulating and has high thermal conductivity. Such a filler is, for example, silicon oxide, aluminum oxide, boron nitride or aluminum nitride. The filler content is 10% by volume or more and 70% by volume or less with respect to the entire sealing member 21.

Further, a low expansion member 18 is provided on the inner wall portions of the case 15 via a buffer member 19. In the first embodiment, the buffer member 19 and the low expansion member 18 are provided on the inner wall portion 16f1 on the short sides. In other words, the buffer member 19 and the low expansion member 18 are provided on the inner wall portion of the side on which the external connection terminal 17 is arranged. Further, in the first embodiment, the case where the step portion 16d is provided on the inner wall portion 16f1 on the short side is shown. In such a case, the buffer member 19 and the low expansion member 18 are provided at least on the inner vertical wall portions that are perpendicular to the front surface of the frame portion 16. Therefore, they are provided on the upper inner wall portion 16c and the lower inner wall portion 16e.

The buffer member 19 is arranged between the inner wall portion 16f1 of the case 15 and the low expansion member 18. In this embodiment, it is sufficient if the buffer member 19 is arranged between the inner wall portion 16f1 of the case 15 and the low expansion member 18, and if there is an external connection terminal 17 between the inner wall portion 16f1 and the low expansion member 18, the buffer member 19 may additionally be provided between the terminal 17 and the low expansion member 18. The buffer member 19 may have a plate shape, for example. The buffer member 19 is preferably arranged without a gap on the inner wall portion 16f1, the external connection terminal 17, and on the low expansion member 18 with which it is in direct contact. The thickness of the buffer member 19 is 0.01 mm or more and 5 mm or less. The buffer member 19 has a smaller elastic modulus than the case 15 (frame portion 16) and the sealing member 21. That is, the buffer member 19 is made of a material softer than the frame portion 16 and the sealing member 21. The elastic modulus of the buffer member 19 is 0.1 MPa or more and 1 GPa or less. Preferably, the elastic modulus is 0.1 MPa or more and 100 MPa or less. The buffer member 19 is made of a material having electrical insulation. Such a material may be rubber, for example, silicone rubber. The buffer member 19 may be an adhesive having adhesiveness. In the present embodiment, the buffer member 19 has adhesiveness.

The low expansion member 18 is arranged between the buffer member 19 and the housing area 16h. The low expansion member 18 may have a plate shape, for example. The low expansion member 18 is preferably formed without a gap on the buffer member 19 and the housing area 16h with which it is in direct contact. The thickness of the low expansion member 18 is 0.01 mm or more and 5 mm or less. The low expansion member 18 has a smaller coefficient of linear expansion than the case 15 (frame portion 16) and the sealing member 21. That is, the low expansion member 18 is made of a material that is less stretchable with respect to heat changes than the frame portion 16 and the sealing member 21. The linear expansion coefficient of the low expansion member 18 is $5 \times 10^{-6}$/K or more and less than $25 \times 10^{-6}$/K. Preferably, the linear expansion coefficient is $5 \times 10^{-6}$/K or more and $15 \times 10^{-6}$/K or less. Further, the low expansion member 18 has a higher glass transition temperature than the case 15 (frame portion 16). Preferably, the glass transition temperature of the low expansion member 18 is higher than 175° C. The elastic modulus of the low expansion member 18 is 5 GPa or more and 30 GPa or less. The low expansion member 18 is made of a material having electrical insulation. The material of such a low expansion member 18 is a thermosetting resin mixed with a filler. The thermoplastic resin is, for example, an epoxy resin or a polyimide resin. Preferably, the low expansion member 18 is the same type of thermosetting resin as the sealing member 21, and for example, both the low expansion member 18 and the sealing member 21 are epoxy resins. By doing so, peeling or cracking between the low expansion member 18 and the sealing member 21 is less likely to occur. Further, the filler may be ceramics having insulating properties and high thermal conductivity, for example, silicon oxide, aluminum oxide, boron nitride or aluminum nitride. The filler content is 50% by volume or more and 90% by volume or less with respect to the entire low expansion member 18. Preferably, the filler content of the low expansion member 18 is higher than the filler content of the sealing member 21. By doing so, the coefficient of linear expansion of the low expansion member 18 can be easily made smaller than that of the sealing member 21.

When there is an external connection terminal 17 between the inner wall portion 16f1 and the housing area 16h, the low expansion member 18 exposes at least the bonding region of the internal wiring portion 17a of the external connection terminal 17 and covers the rest of the external connection terminal 17. In the case of the first embodiment, the low expansion member 18 covers the upper inner wall portion 16*c*, the lower inner wall portion 16*e*, and the stepped portion 16*d* excluding the internal wiring portion 17*a* of the external connection terminal 17. That is, the low expansion member 18 fixes the external connection terminal 17 to the frame portion 16. Further, the external wiring portion 17*b* of the external connection terminal 17 is sandwiched between the low expansion member 18 and the groove inner wall portion 16*g*1 of the terminal groove 16*g*. In the first embodiment, the case where the terminal groove 16*g* is formed in the frame portion 16 to provide the location at which the external connection terminal 17 is installed is described as an example. As long as the external connection terminal 17 is fixed by the frame portion 16 and the low expansion member 18, the terminal groove 16*g* in the frame portion 16 may not be necessary. For example, instead of forming the terminal groove 16*g* in the frame portion 16, a groove may be formed in the region corresponding to the external connection terminal 17 on the back surface of the low expansion member 18. Alternatively, only the groove step portion 16*g*2 may be formed with respect to the frame portion 16, and a groove may be formed in the region sandwiching the upper inner wall portion 16*c* and the external connection terminal 17 on the back surface of the low expansion member 18. The details of the low expansion member 18 will be described later.

The sealing member 21 seals the semiconductor unit 11 arranged in the housing area 16*h*. The sealing member 21 seals the inner area (housing area 16*h*) surrounded by the low expansion member 18 provided via the buffer member 19 and by the frame portion 16. Such a sealing member 21 is a thermosetting resin mixed with a filler. The thermosetting resin is, for example, an epoxy resin, a phenol resin, a maleimide resin, or a polyester resin. Preferably, the low expansion member 18 and the sealing member 21 are the same type of thermosetting resin. The low expansion member 18 and the sealing member 21 are, for example, epoxy resins. Further, the filler may be ceramics having insulating properties and high thermal conductivity. Such a fillers is, for example, silicon oxide, aluminum oxide, boron nitride or aluminum nitride. The filler content is 50% by volume or more and 90% by volume or less with respect to the entire sealing member 21. Further, the filler content of the low expansion member 18 is higher than the filler content of the sealing member 21.

If the low expansion member 18 were not provided on the inner wall portion 16*f*1 of the case 15 via the buffer member 19 in the semiconductor device 10, internal stress would be generated due to the difference in the linear expansion coefficients of the components as the temperature changes. Specifically, the sealing member 21 would be pressed and pulled by the expansion and contraction of the frame portion 16 of the case 15, which has a larger coefficient of thermal expansion than the other constituent members. Therefore, the sealing member 21 would be distorted due to internal stress and the semiconductor device 10 would be warped and deformed. Therefore, in such a device, the bonding wire 20 was broken, the semiconductor chips 13*a* and 13*b* were damaged, and the insulating property was deteriorated due to the interfacial peeling between the members.

On the other hand, in the semiconductor device 10 of the present embodiment, the buffer member 19 and the low expansion member 18 are provided between the frame portion 16 of the case 15 and the sealing member 21. The coefficient of linear expansion of the low expansion member 18 is smaller than that of the frame portion 16 of the case 15 and the sealing member 21. That is, the low expansion member 18 has a small expansion/contraction due to a temperature change. Therefore, the expansion/contraction of the frame portion 16 can be relaxed before reaching the sealing member 21, and the pressing/pulling on the sealing member 21 can be suppressed. Further, the buffer member 19 has a smaller elastic modulus than the frame portion 16 of the case 15 and the sealing member 21. Therefore, the expansion/contraction of the frame portion 16 due to the temperature change is suppressed by the deformation of the buffer member 19, and the pressing/pulling of the sealing member 21 is suppressed. Therefore, in the semiconductor device 10 having such a configuration, the reliability against temperature changes can be improved. Further, since the low expansion member 18 and the sealing member 21 are made of the same type of material, the adhesion is good. Therefore, peeling of the sealing member 21 from the low expansion member 18 is suppressed. Further, the low expansion member 18 has a higher glass transition temperature than the case 15, and as described above, since it is made of the same type of material as the sealing member 21, the glass transition temperature is the same as that of the sealing member 21. Therefore, even if the temperature of the low expansion member 18 and the sealing member 21 rises sharply, there is almost no difference in the property changing point of the volume thermal expansion. Therefore, even if a momentary thermal shock occurs, peeling is unlikely to occur between the sealing member 21 and the low expansion member 18, and peeling, even if it occurs, is unlikely to expand. Therefore, the semiconductor device 10 prevents a decrease in reliability with respect to a temperature change.

Further, in the semiconductor device 10, the buffer member 19 and the low expansion member 18 are provided on the inner wall portion 16*f*1 on the short sides of the case 15. The stress that occurs parallel to the long side is greater than the stress that occurs parallel to the short side. Therefore, since the buffer member 19 and the low expansion member 18 are provided on the inner wall portion 16*f*1 only on the short sides of the case 15, the reliability against temperature change can be effectively improved with such a small area.

Further, in the semiconductor device 10, the buffer member 19 and the low expansion member 18 are provided on the inner wall portion (in the present embodiment, the inner wall portion 16*f*1) of the side(s) on which the external connection terminal 17 of the case 15 is arranged. By doing so, it is possible to easily perform outsert molding in which the external connection terminal 17 is inserted after molding the frame portion 16. Therefore, the man-hours for manufacturing the semiconductor device 10 can be reduced, and the manufacturing cost can be lowered. Further, the internal stress of the frame portion 16 can be reduced and voids inside the frame portion 16 can be reduced as compared with the case where the external connection terminal 17 is insert-molded.

Figure 3:
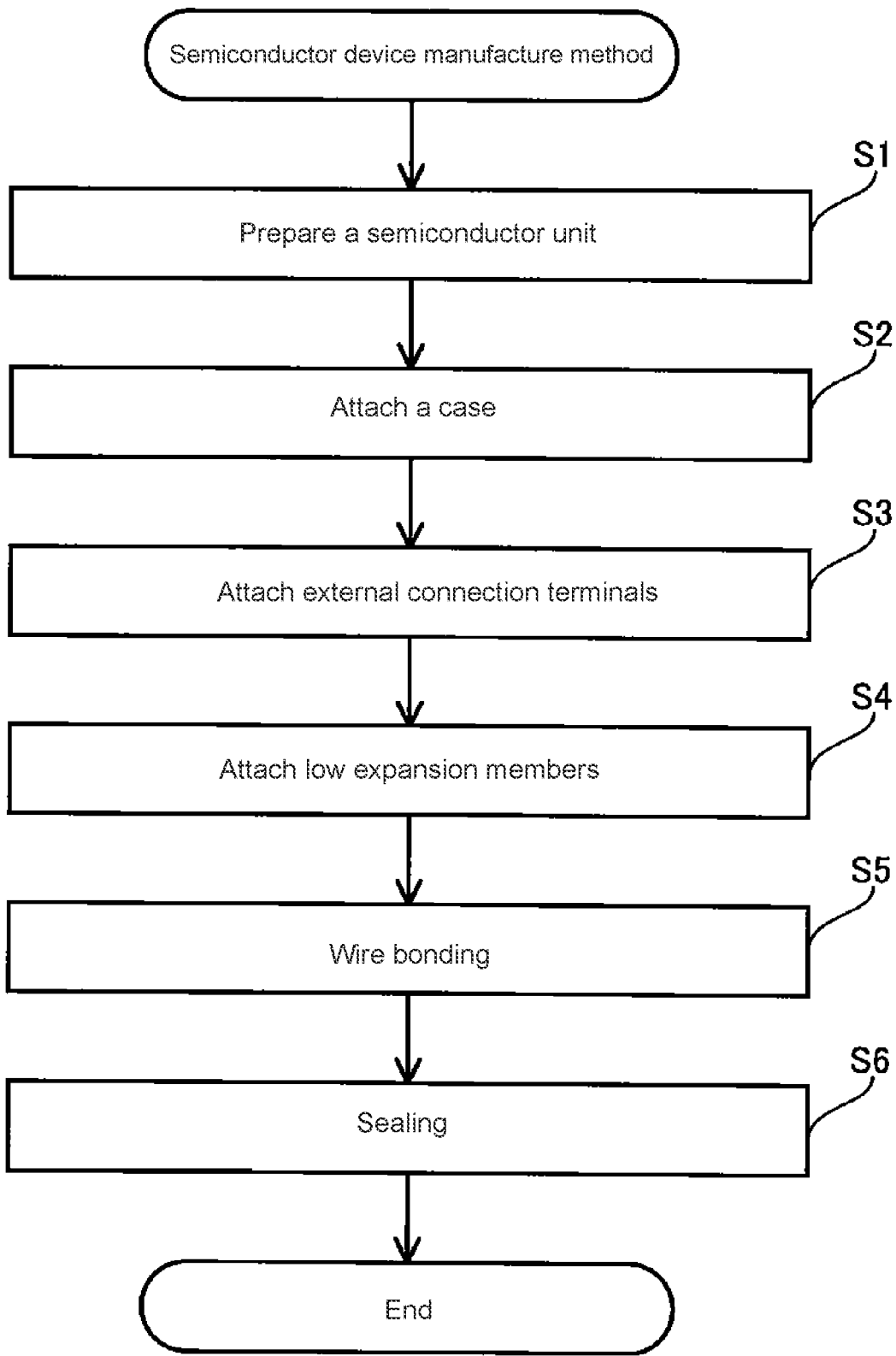
FIG. 3 is a flowchart of a manufacturing method of the semiconductor device of the first embodiment.
Figure 6:
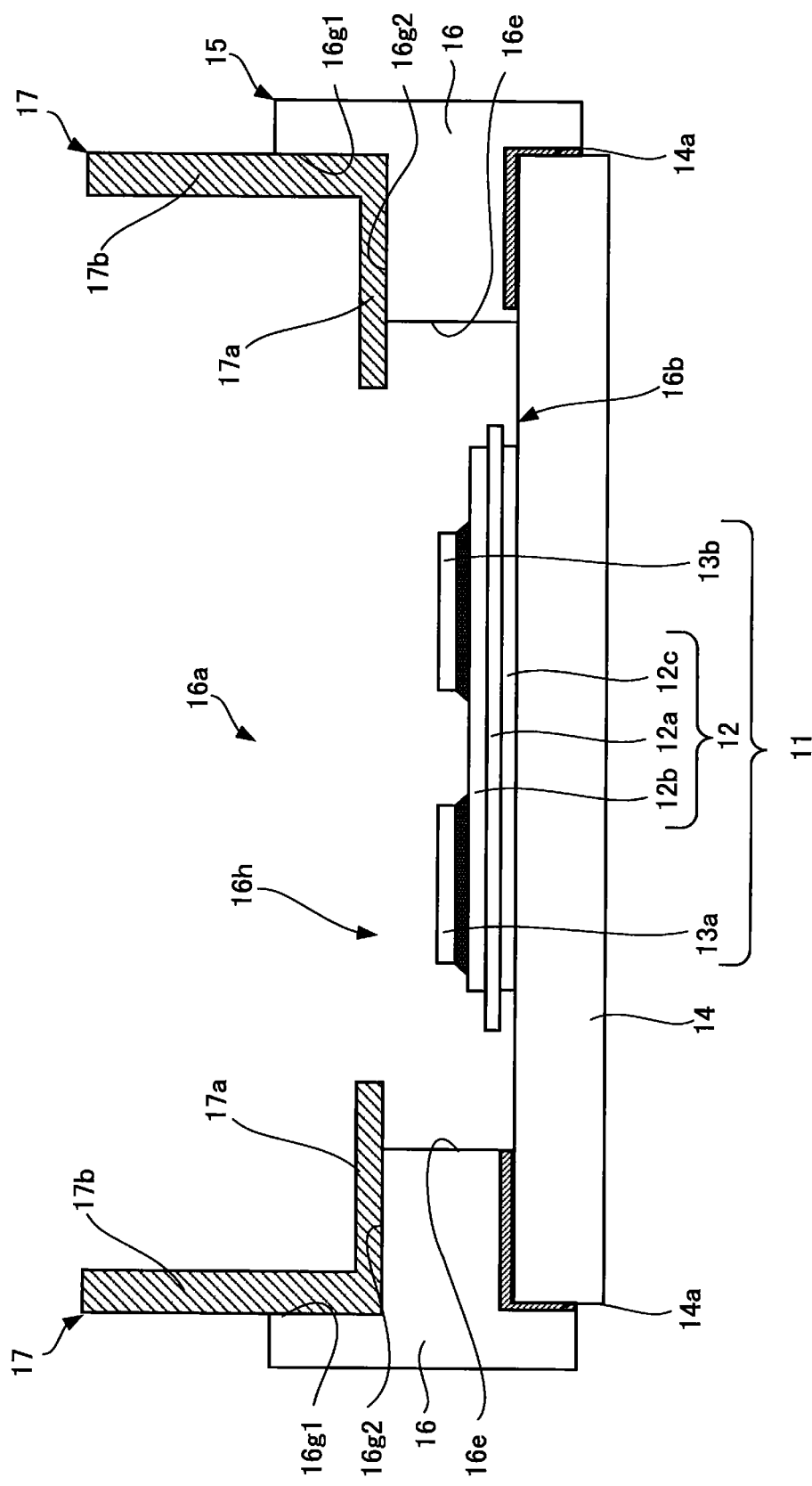
FIG. 6 shows a states after the external connection terminal attachment process is performed in the manufacturing method of the semiconductor device of the first embodiment.
Figure 7:
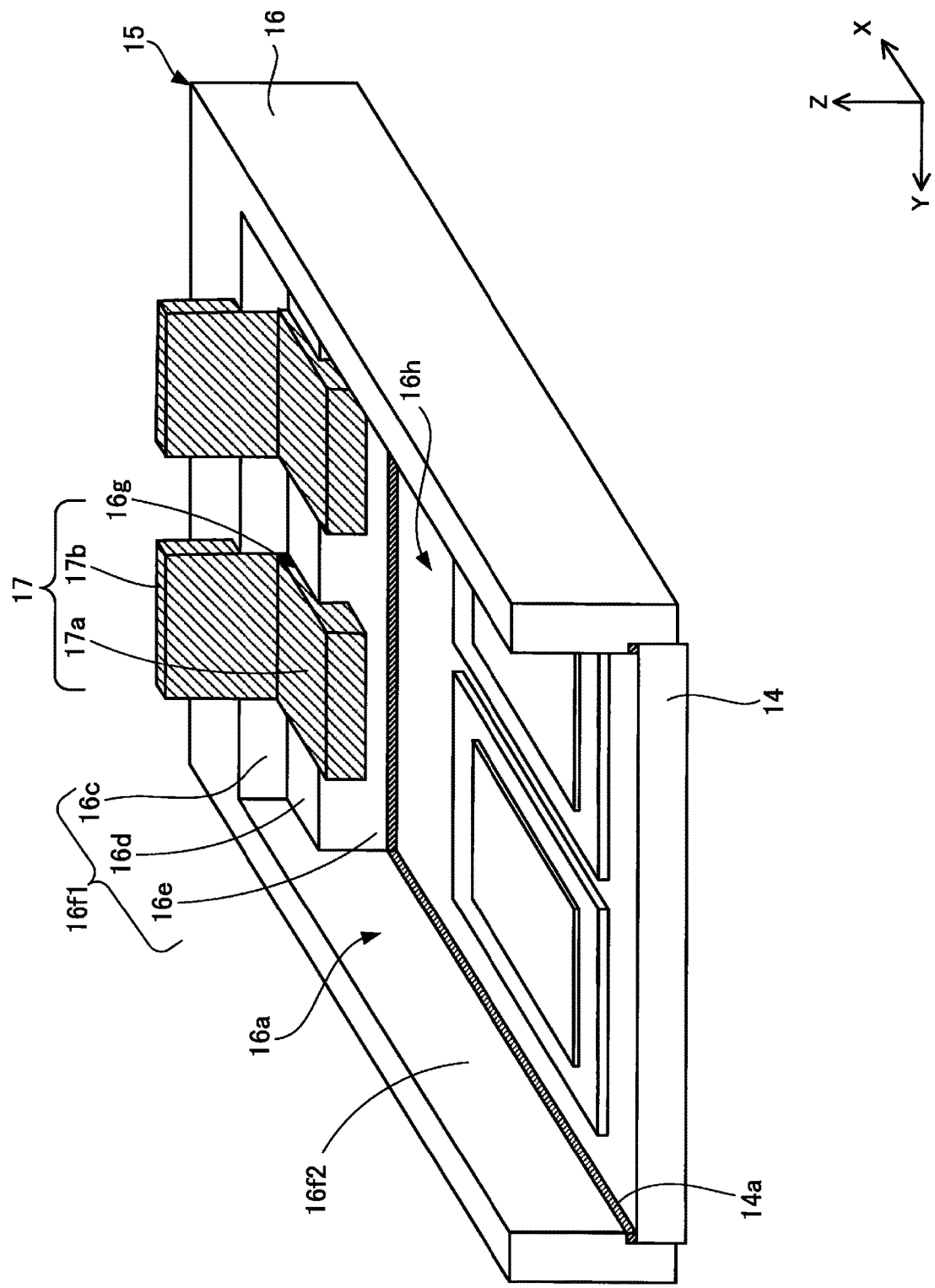
FIG. 7 shows the state after the external connection terminal attachment process is performed in the manufacturing method of the semiconductor device of the first embodiment.
Figure 8:
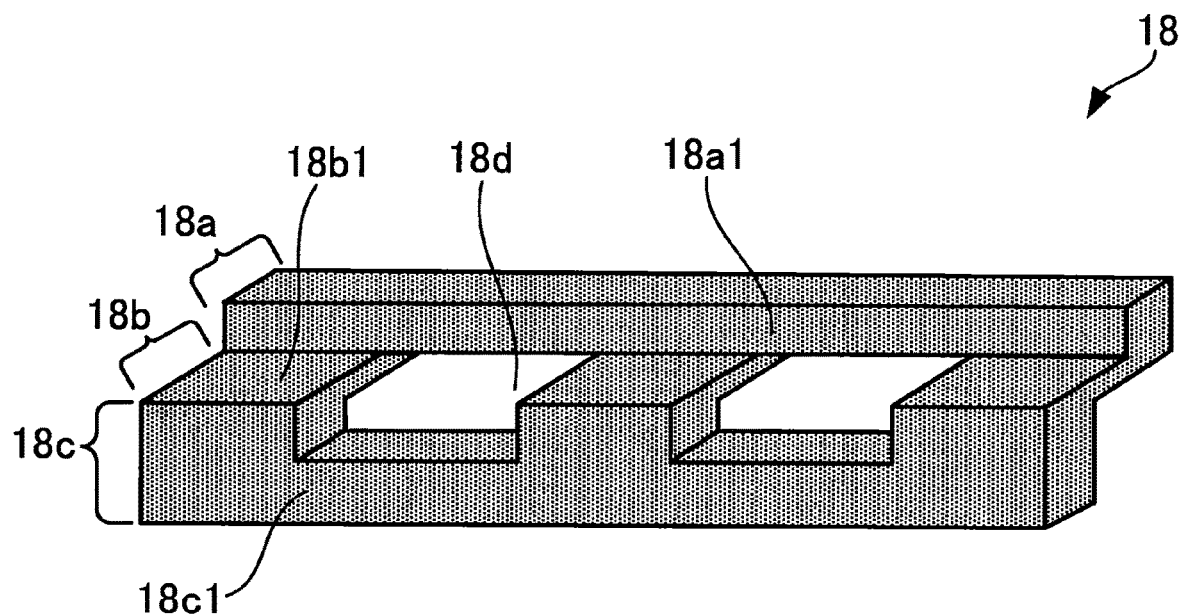
FIG. 8 shows a low expansion member in the semiconductor device of the first embodiment.
Figure 8:
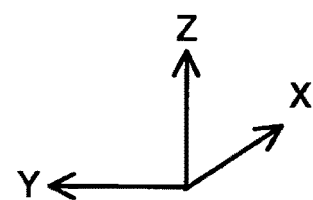
Figure 9:
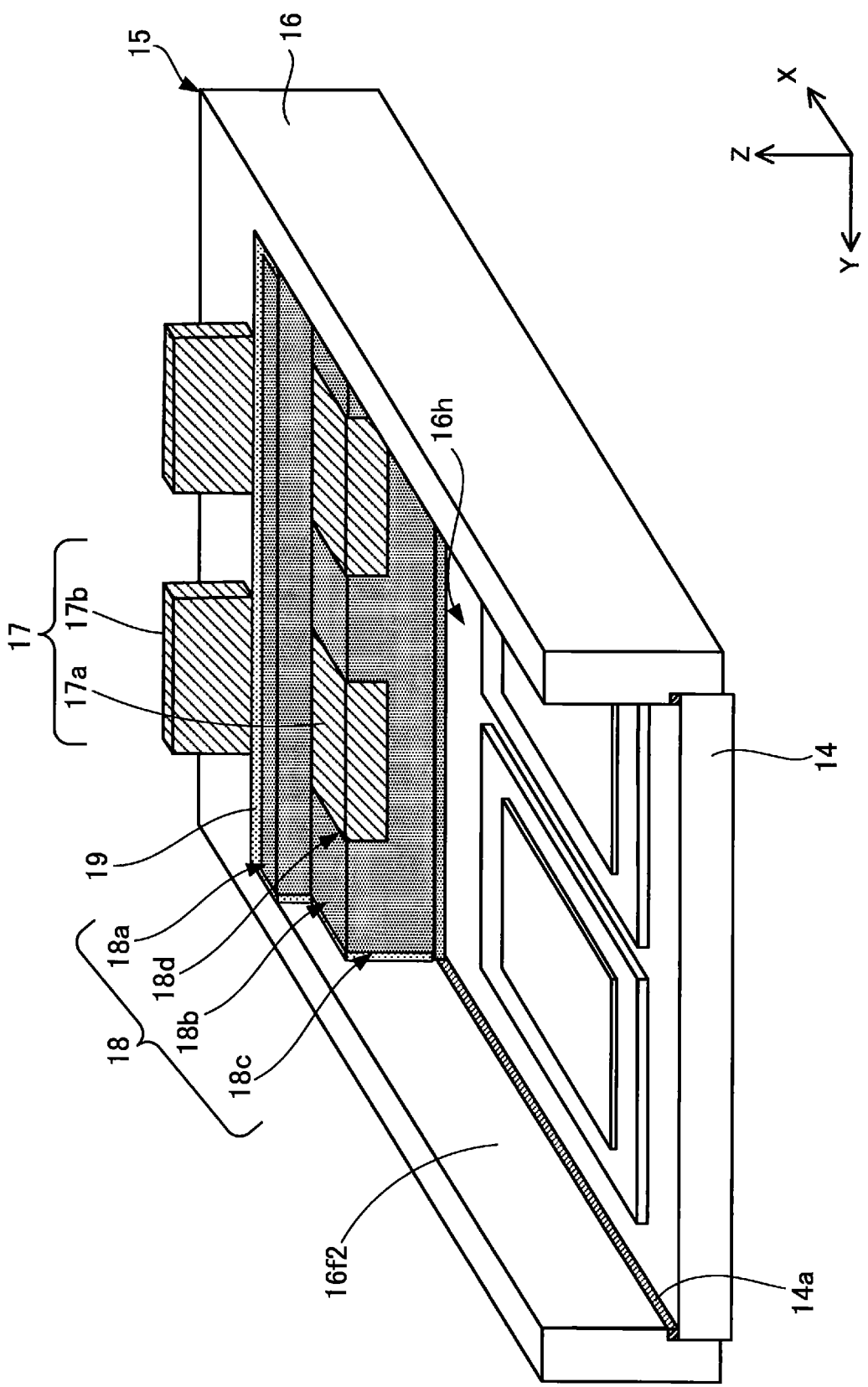
FIG. 9 shows a state after the low expansion member attaching process is performed in the manufacturing method of the semiconductor device of the first embodiment.

Next, a method of manufacturing such a semiconductor device 10 will be described with reference to FIGS. 3 and 4 to 9. FIG. 3 is a flowchart showing a method of manufacturing the semiconductor device of the first embodiment. FIGS. 4 and 5 are diagrams for explaining a state after the case attaching step is performed in the method for manufacturing the semiconductor device of the first embodiment. FIGS. 6 and 7 are diagrams for explaining a state after the external connection terminal attachment step is performed in the method for manufacturing the semiconductor device of the first embodiment. FIGS. 4 and 6 are cross-sectional views at locations corresponding to FIG. 1. FIGS. 5 and 7 are perspective views on the right side in FIGS. 4 and 6. FIG. 8 is a diagram for explaining the low expansion member 18 in the semiconductor device of the first embodiment. FIG. 9 is a diagram for explaining a state after the process of attaching the low expansion member is performed in the method for manufacturing the semiconductor device of the first embodiment. Note that the adhesive is omitted in FIGS. 4 and 6, and the semiconductor chips are omitted in FIGS. 5, 7 and 9.

First, a semiconductor unit preparation step of preparing the semiconductor unit 11 is performed (step S1 in FIG. 3). Here, the semiconductor chips 13a and 13b are joined onto the prescribed circuit patterns 12b of the insulating circuit board 12. Further, the semiconductor unit 11 is joined to the front surface of the heat radiating plate 14. Next, a case attaching step of attaching the case 15 (frame portion 16) to the heat radiating plate 14 to which the semiconductor unit 11 is joined is performed (step S2 in FIG. 3). Here, the frame portion 16 of the case 15 is attached. As shown in FIGS. 4 and 5, the lower opening 16b side of the frame portion 16 is joined to the front surface of the heat radiating plate 14 to which the semiconductor unit 11 is joined. Here, the frame portion 16 is arranged on the heat radiating plate 14 via the adhesive 14a and cured. For example, it is later heated at a prescribed temperature for a prescribed time to cure the adhesive 14a. As a result, the frame portion 16 is joined to the heat radiating plate 14 via the adhesive 14a.

Next, an external connection terminal attachment step of attaching the external connection terminals 17 to the frame portion 16 is performed (step S3 in FIG. 3). The external connection terminal 17 is arranged in the terminal groove 16g of the frame portion 16. At this time, the external connection terminal 17 is merely press-fitted or simply arranged in the terminal groove 16g of the frame portion 16, and no bonding member or the like is used. As a result, as shown in FIGS. 6 and 7, the internal wiring portion 17a of the external connection terminal 17 is arranged in the groove step portion 16g2 of the terminal groove 16g, and the external wiring portion 17b is arranged in the groove inner wall portion 16g1. In the external connection terminal 17 arranged in this way, the tip of the internal wiring portion 17a protrudes toward the housing area 16h from the lower inner wall portion 16e, and the front surface of the internal wiring portion 17a protrudes above the step portion 16d. The surface (housing area 16h side) of the external wiring portion 17b forms the same plane as the upper inner wall portion 16c, and the tip of the external wiring portion 17b protrudes upward from the top surface of the frame portion 16.

Next, a low expansion member attachment step of attaching the low expansion members 18 to the case 15 is performed (step S4 in FIG. 3). As shown in FIG. 8, the low expansion member 18 used in the first embodiment integrally includes an upper frame portion 18a, an intermediate frame portion 18b, and a lower frame portion 18c. The upper frame portion 18a has a rectangular columnar shape corresponding to the upper inner wall portion 16c, and has an upper main surface 18a1 on the front side thereof. The intermediate frame portion 18b has a flat plate shape corresponding to the step portion 16d, and has an intermediate main surface 18b1 on the front side. The lower frame portion 18c has a rectangular columnar shape corresponding to the lower inner wall portion 16e, and has a lower main surface 18c1 on the front side. The thickness of the low expansion member 18 (upper frame portion 18a, intermediate frame portion 18b, lower frame portion 18c) may be different as shown in FIG. 8, or may be the same. Therefore, the low expansion member 18 also forms a staircase shape along the inner wall portion 16f1 composed of the upper inner wall portion 16c, the step portion 16d, and the lower inner wall portion 16e of the frame portion 16. Further, terminal openings 18d corresponding to the external connection terminals 17 are formed in the intermediate frame portion 18b of the low expansion member 18. Such a low expansion member 18 is also molded by injection molding using an epoxy resin containing a filler.

Before attaching the low expansion member 18, the buffer member 19 is attached to the frame portion 16 and the external connection terminal 17. The buffer member 19 is applied to the areas of the frame portion 16 and the external connection terminal 17 that are to be covered by the low expansion member 18. The buffer member 19 can be arranged using a liquid adhesive. In this case, first, the buffer member 19 is arranged on the upper inner wall portion 16c of the frame portion 16 including the surface (housing area 16h side) of the external wiring portion 17b of the external connection terminal 17. Further, the buffer member 19 is arranged on the upper inner wall portion 16c side of the step portion 16d of the frame portion 16 including the front surface of the internal wiring portion 17a of the external connection terminal 17. The buffer member 19 is arranged in the remaining portion of the step portion 16d avoiding the terminal opening 18d. The buffer member 19 is also arranged in the lower frame portion 18c of the frame portion 16 while avoiding the terminal opening portion 18d. Alternatively, a sheet-shaped buffer member 19 having an opening corresponding to the terminal opening 18d may be attached to the upper inner wall portion 16c of the frame portion 16, the opened step portion 16d, and on the opened internal wiring portion 17a.

Then, the upper frame portion 18a of the low expansion member 18 is brought into contact with the surfaces (housing area 16h side) of the upper inner wall portion 16c and the external wiring portion 17b of the external connection terminal 17. The internal wiring portion 17a of the external connection terminal 17 is exposed from the terminal opening 18d of the intermediate frame portion 18b and the lower frame portion 18c of the low expansion member 18, and the intermediate frame portion 18b and the lower frame portion 18c are brought into contact with the step portion 16d and the lower inner wall portion 16e, respectively. As a result, as shown in FIG. 9, the low expansion member 18 can be attached to the frame portion 16. Further, when the buffer member 19 has adhesiveness, the low expansion member 18 can be reliably fixed to the frame portion 16. As a result, the external connection terminal 17 can be fixed to the terminal groove 16g of the frame portion 16.

The buffer member 19 may be attached to the surface (back surface) of the low expansion member 18 on the frame portion 16 side instead of the frame portion 16 side. In this case as well, the buffer member 19 may be a liquid or sheet-like adhesive. In this embodiment, the case where the low expansion member 18 is attached after the external connection terminal 17 is attached to the frame portion 16 is taken as an example, but the present invention is not limited to such a case; the external connection terminal 17 may be attached to the low expansion member 18 first and then may be attached to the frame portion 16 to which the buffer member 19 is attached. However, in this case, it is desirable to attach the external connection terminal 17 to the low expansion member 18 via the buffer member 19. Further, it is desirable that a groove into which the external connection terminal 17 is fitted is formed in a region on the back surface of the low expansion member 18 to which the external connection terminal 17 is attached.

Further, in the present embodiment, the case attaching step (step S2 in FIG. 3) is followed by the external connection terminal attaching step (step S3 in FIG. 3) and the low expansion member attaching step (step S4 in FIG. 3), as an example. But the present invention is not limited to this; the external connection terminal attaching step (step S3 in FIG. 3) and the low expansion member attaching step (step S4 in FIG. 3) may be performed first, and then the case attaching step (step S2 in FIG. 3) may be performed. Further, heating for curing the adhesive 14a in the case attaching step (step S2 in FIG. 3) and hearing for the buffer member 19 may be performed in a single heating step at the same time.

Next, a bonding step of appropriately connecting the internal wiring portions 17a of the external connection terminals 17, the semiconductor chips 13a, 13b, and the circuit patterns 12b of the insulating circuit board 12 with the bonding wire 20 is performed (step S5 in FIG. 3). Finally, a sealing step of filling the housing area 16h to which the low expansion member 18 of the case 15 is attached with the sealing member 21 is performed to seal the semiconductor unit 11 and the other components therein (step S6 in FIG. 3). As a result, the semiconductor device 10 shown in FIGS. 1 and 2 can be obtained.

The semiconductor device 10 includes a semiconductor chips 13a, 13b, a frame portion 16 in which the inner wall portion 16f1 thereof surrounds the housing area 16h, the case 15 for housing the semiconductor chips 13a, 13b in the housing area 16h, the buffer member 19 provided on the side of the housing area 16h of the inner wall portion 16f1, the low expansion member 18 provided on the housing area 16h side of the inner wall portion 16f1 via the buffer member 19, and the sealing member 21 for sealing the inside of the housing area 16h. Here, the buffer member 19 has a smaller elastic modulus than the case 15 and the sealing member 21, and the low expansion member 18 has a smaller linear expansion coefficient than the case 15 and the sealing member 21. Therefore, it is possible to suppress pressing/pulling on the sealing member 21 due to expansion/contraction of the frame portion 16 due to temperature changes. Therefore, in the semiconductor device 10 having such a configuration, the reliability against temperature changes can be improved.

Second Embodiment

Figure 10A:
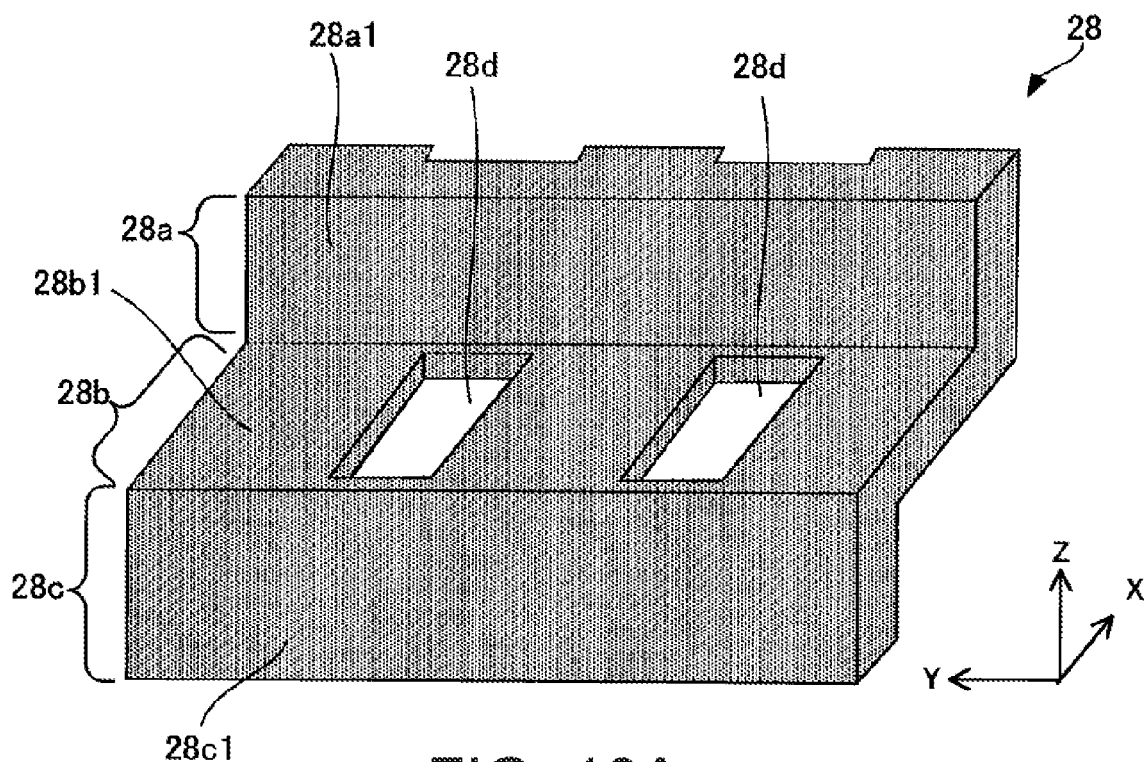
FIGS. 10A-10B shows a low expansion member in a semiconductor device according to a second embodiment.
Figure 10B:
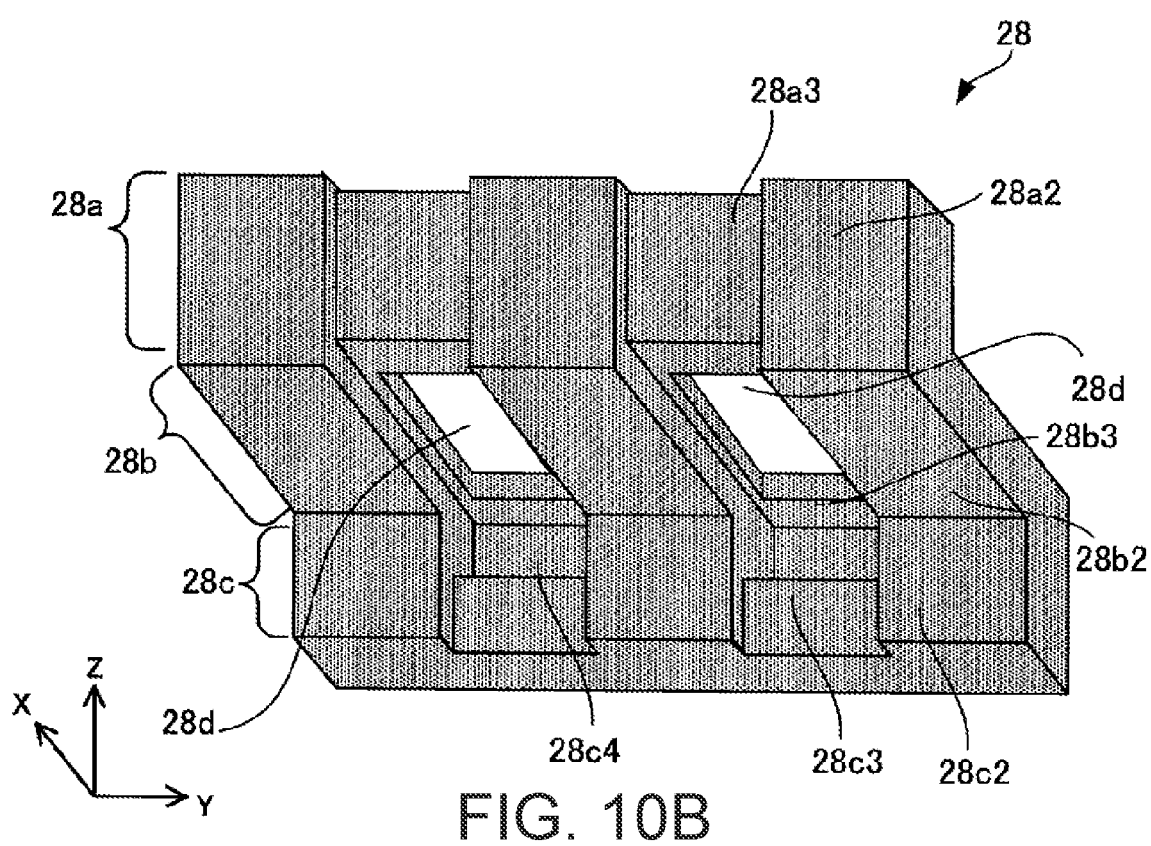

In a second embodiment, another form of the low expansion member will be described with reference to FIGS. 10A-10B. FIGS. 10A-10B are diagrams for explaining a low expansion member 28 in the semiconductor device of the second embodiment. FIG. 10A is a perspective view of the front side of the low expansion member 28, and FIG. 10B is a perspective view of the back surface side of the low expansion member 28. Further, the semiconductor device of the second embodiment has the same configuration as the semiconductor device 10 of the first embodiment except for the low expansion member 28. The low expansion member 28 is formed of the same material and the same method as the low expansion member 18.

The low expansion member 28 is attached to the inner wall portion 16f1 on the short side, which is composed of the upper inner wall portion 16c, the step portion 16d, and the lower inner wall portion 16e of the frame portion 16. The low expansion member 28 is opened only at portions corresponding to the bonding regions of the internal wiring portions 17a of the external connection terminals 17. As shown in FIG. 10A, such a low expansion member 28 integrally includes an upper frame portion 28a, an intermediate frame portion 28b, and a lower frame portion 28c. With respect to the frame portion 16, the upper frame portion 28a has a rectangular columnar shape corresponding to the upper inner wall portion 16c, and the upper main surface 28a1 is provided on the front side. The intermediate frame portion 28b has a flat plate shape corresponding to the step portion 16d, and has an intermediate main surface 28b1 on the front side. The lower frame portion 28c has a rectangular columnar shape corresponding to the lower inner wall portion 16e, and is provided with a lower main surface 28c1 on the front side. The thickness of the low expansion member 28 (upper frame portion 28a, intermediate frame portion 28b, lower frame portion 28c) may be different as shown in FIGS. 10A-10B, or may be the same. Therefore, the low expansion member 28 also forms a staircase shape along the upper inner wall portion 16c, the step portion 16d, and the lower inner wall portion 16e of the frame portion 16. Further, the intermediate frame portion 28b of the low expansion member 28 is formed with terminal openings 28d corresponding to the bonding regions of the internal wiring portions 17a of the external connection terminals 17. Further, the low expansion member 28 has grooves formed on the back surface for attaching the external connection terminals 17. That is, in the low expansion member 28, the upper groove 28a3, the intermediate groove 28b3, and the lower groove 28c3 are continuously formed on the back surface. As shown in FIG. 10B, the upper groove 28a3 is on the upper back surface 28a2 of the upper frame portion 28a, the intermediate groove 28b3 is on the intermediate back surface 28b2 of the intermediate frame portion 28b, and the lower groove 28c3 is on the lower back surface 28c2 of the lower frame portion 28c. Further, a tip housing groove 28c4 is formed on the intermediate frame portion 28b side of the lower back surface 28c2 of the lower frame portion 28c. The tip housing groove 28c4 is formed deeper than the lower groove 28c3. The corners of the upper groove 28a3, the intermediate groove 28b3, the lower groove 28c3, and the tip housing groove 28c4 may be chamfered in an R shape.

Figure 11A:
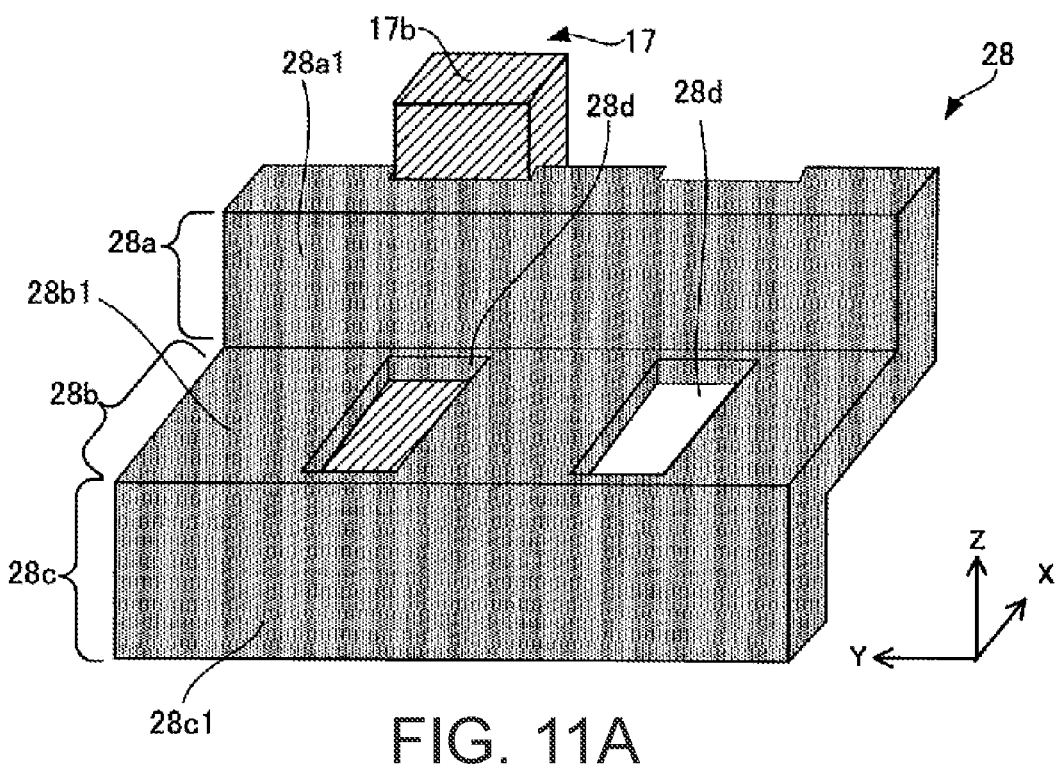
FIGS. 11A-11B shows a process of attaching an external connection terminal in the semiconductor device of the second embodiment.
Figure 11B:
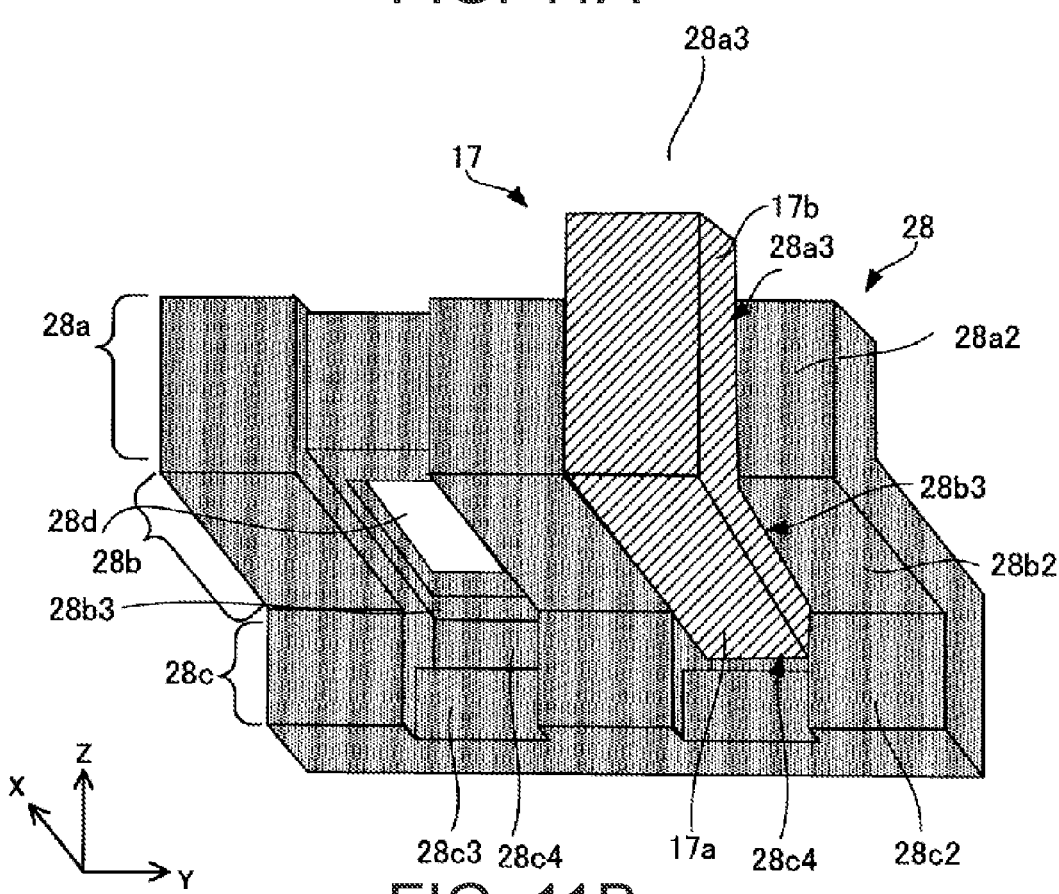
Figure 12:
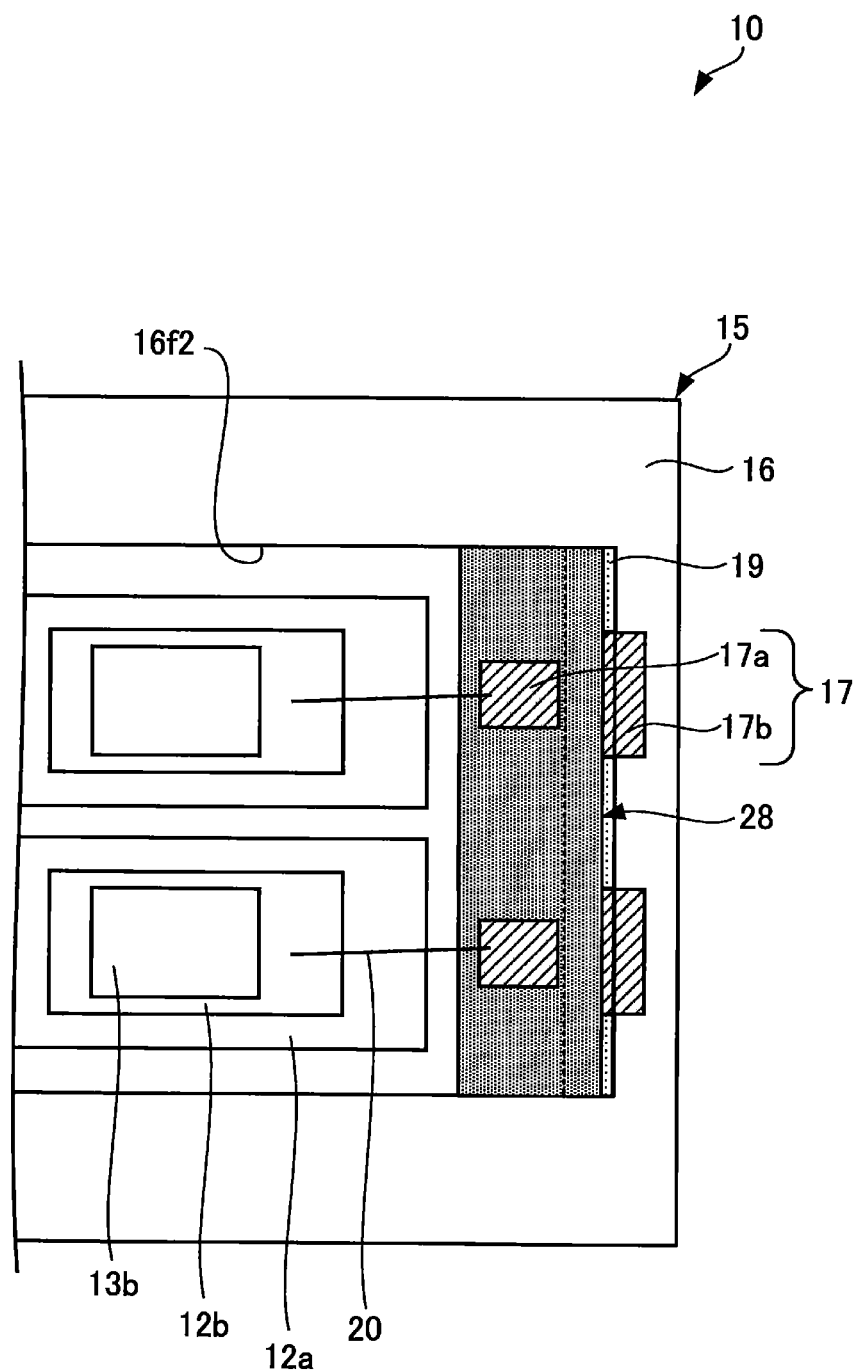
FIG. 12 is a main part plan view of the semiconductor device of the second embodiment.

Next, a method of manufacturing the semiconductor device 10 when such a low expansion member 28 is used will be described with reference to FIGS. 11A-11B and 12 together with FIG. 3. FIGS. 11A-11B are diagrams for explaining an external connection terminal attachment step in the semiconductor device of the second embodiment. FIG. 11A is a perspective view of the front surface side when the external connection terminal 17 is attached to the low expansion member 28, and FIG. 11B is a perspective view of the back side when the external connection terminal 17 is attached to the low expansion member 28. Further, FIG. 12 is a plan view of a main part of the semiconductor device according to the second embodiment. Note that FIG. 12 corresponds to the case where the low expansion member 28 is applied in FIG. 2. The sealing member 21 is omitted in FIG. 12

First, as in the first embodiment, the semiconductor unit preparation step of preparing the semiconductor unit 11 (step S1 in FIG. 3) and the case attaching step of attaching the case 15 (frame portion 16) to the semiconductor unit 11 (Step S2 in FIG. 3) are performed respectively.

In the next step of attaching the external connection terminals (step S3 in FIG. 3), the external connection terminals 17 are attached not to the case 15 (frame portion 16) but to the low expansion member 28. Here, the external connection terminals 17 are attached to the back surface of the low expansion member 28. That is, as shown in FIG. 11B, the external wiring portion 17b of the external connection terminal 17 is fitted into the upper groove 28a3 of the upper frame portion 28a. Further, as shown in FIG. 11B, the internal wiring portion 17a of the external connection terminal 17 is fitted into the intermediate groove 28b3 of the intermediate frame portion 28b, and the tip portion of the internal wiring portion 17a is fitted into the tip housing groove 28c4 of the lower frame portion 28c. As a result, as shown in FIG. 11A, the external connection terminal 17 is attached to the low expansion member 28, and the bonding region of the internal wiring portion 17a of the external connection terminal 17 is exposed from the terminal opening 28d of the intermediate frame portion 28b of the low expansion member 28. Another external connection terminal 17 is also attached to the other side of the low expansion member 28.

Next, a low expansion member attachment step of attaching the low expansion member 28 to the case 15 (frame portion 16) is performed (step S4 in FIG. 3). The low expansion member 28 to which the external connection terminals 17 are attached from the back surface side is attached to the frame portion 16. Before attaching the low expansion member 28, the buffer member 19 is attached to the frame portion 16. First, the buffer member 19 is attached to the upper inner wall portion 16c of the frame portion 16 while avoiding the groove inner wall portion 16g1. Further, the buffer member 19 is attached on the step portion 16d while avoiding the groove step portion 16g2 of the step portion 16d of the frame portion 16. Then, the buffer member 19 is attached on the lower inner wall portion 16e while avoiding the groove step portion 16g2 of the lower inner wall portion 16e. Alternatively, as in the first embodiment, the silicone rubber sheet having openings corresponding to the terminal groove 16g may be attached to the upper inner wall portion 16c of the frame portion 16, the opened step portion 16d, and to the opened internal wiring portion 17a, as the sheet-shaped buffer member 19. Alternatively, a liquid buffer member 19 may be applied while avoiding the opening portions.

Further, the buffer member 19 may be attached to the back surface of the low expansion member 28 excluding the region where the external connection terminal 17 is attached from the back surface side. Specifically, the buffer member 19 may be attached to the upper back surface 28a2 excluding the upper groove 28a3 of the low expansion member 28, the intermediate back surface 28b2 excluding the intermediate groove 28b3, and to the lower back surface 28c2 excluding the lower groove 28c3. Then, the upper frame portion 28a of the low expansion member 28 is brought into contact with the upper inner wall portion 16c, and the external wiring portion 17b of the external connection terminal 17 attached to the low expansion member 28 is fitted into the groove inner wall portion 16g1 of the terminal groove 16g. The intermediate frame portion 28b of the low expansion member 28 is brought into contact with the step portion 16d, and the internal wiring portion 17a of the external connection terminal 17 that has been attached to the low expansion member 28 is fitted into the groove step portion 16g2 of the terminal groove 16g. The lower frame portion 28c of the low expansion member 28 is brought into contact with the lower inner wall portion 16e. As a result, the low expansion member 28 to which the external connection terminal 17 is attached can be attached to the frame portion 16. Further, when the buffer member 19 has adhesiveness, the low expansion member 28 can be reliably fixed to the frame portion 16. As a result, the external connection terminal 17 can be fixed to the terminal groove 16g of the frame portion 16. In this embodiment, a case where the external connection terminal 17 is attached to the low expansion member 28 and then the low expansion member 28 is attached to the frame portion 16 is explained as an example. But the present invention is not limited to this; the external connection terminal 17 may be attached to the frame portion 16 side first, and the low expansion member 28 to which the buffer member 19 is attached may be attached thereafter, for example.

Further, also in the present embodiment, the case attaching step (step S2 in FIG. 3) is followed by the external connection terminal attaching step (step S3 in FIG. 3) and the low expansion member attaching step (step S4 in FIG. 3), as an example. But the present invention is not limited to this; the external connection terminal attaching step (step S3 in FIG. 3) and the low expansion member attaching step (step S4 in FIG. 3) may be performed first, and then the case attaching step (step S2 in FIG. 3) may be performed thereafter. Further, heating for curing the adhesive 14a in the case attaching step (step S2 in FIG. 3) and heating for the buffer member 19 may be performed in a single heating step at the same time.

Next, a bonding step is performed in which the bonding region of the internal wiring portion 17a of the external connection terminal 17 exposed from the terminal opening 28d of the low expansion member 28, the semiconductor chips 13a and 13b, and the circuit patterns 12b of the insulating circuit board 12 are appropriately connected via the bonding wires 20 (step S5 in FIG. 3). As shown in FIG. 12, the bonding region of the internal wiring portion 17a of the external connection terminal 17 exposed from the terminal opening 28d of the low expansion member 28 and the circuit pattern 12b are connected by the bonding wire 20. Finally, a sealing step of filling, with the sealing member 21, the housing area 16h to which the low expansion member 18 of the case 15 is attached is performed to seal the semiconductor unit 11 and the other components therein (step S6 in FIG. 3). As a result, the semiconductor device 10 is obtained.

The semiconductor device 10 provided with the low expansion member 28 instead of the low expansion member 18, as described above, can obtain the same effects as those of the first embodiment. In addition, the low expansion member 28 has a wider area covering the frame portion 16 than the low expansion member 18. Therefore, the semiconductor device 10 using the low expansion member 28 is more reliable in suppressing pressing/pulling of the sealing member 21 due to the expansion/contraction of the frame portion 16 due to temperature changes, as compared with the case where the low expansion member 18 is used. Therefore, the semiconductor device 10 including the low expansion member 28 can even further improve the reliability against temperature changes as compared with the case where the low expansion member 18 is provided.

Third Embodiment

Figure 13:
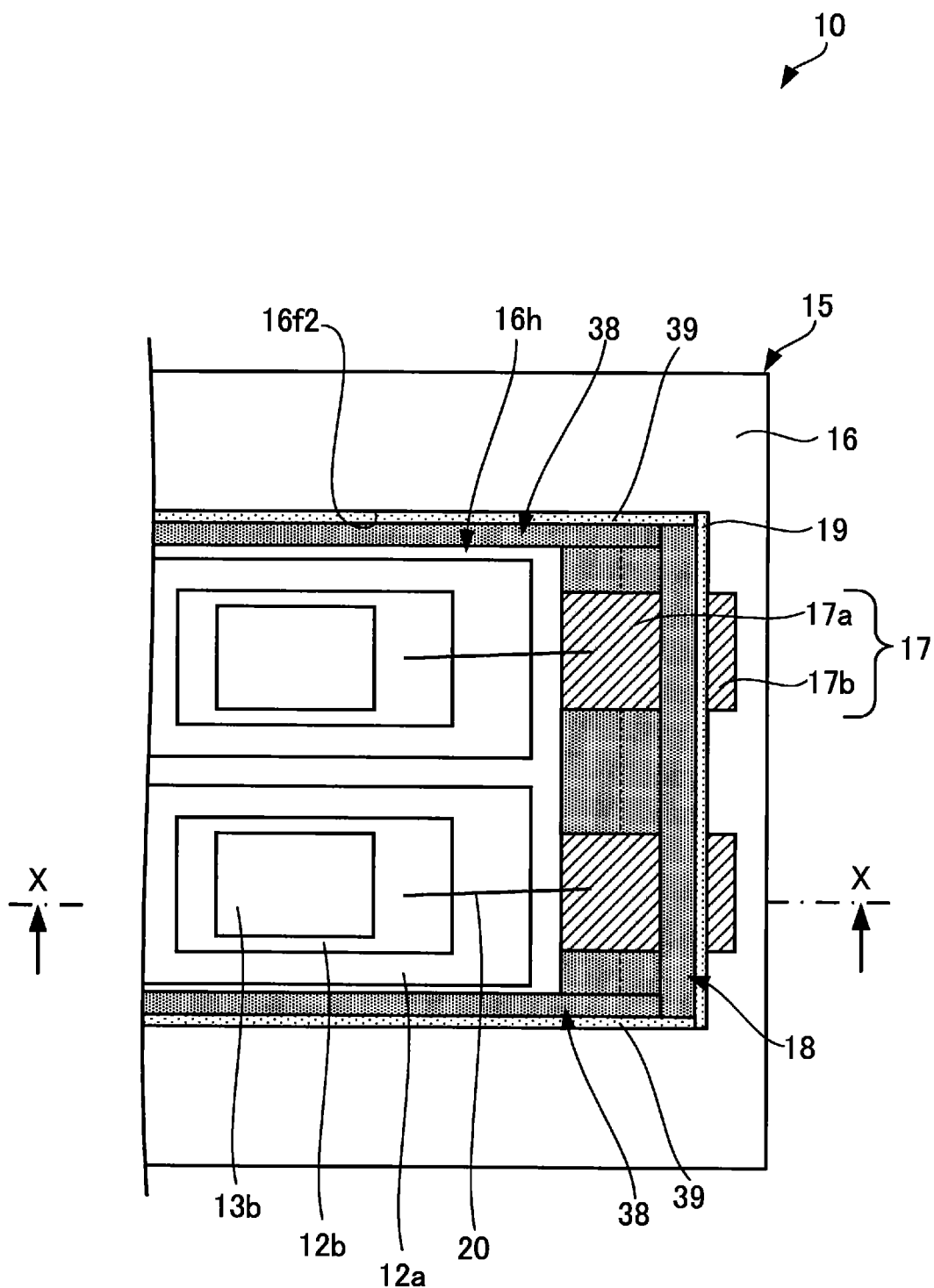
FIG. 13 is a main part plan view of a semiconductor device of a third embodiment.

The semiconductor device of a third embodiment will be described with reference to FIG. 13. FIG. 13 is a plan view of a main part of the semiconductor device according to the third embodiment. The semiconductor device 10 of the third embodiment has the same configuration as the semiconductor device 10 of the first embodiment except for a low expansion member 38. The low expansion member 38 is also molded by the same material and the same method as the low expansion member 18.

In the semiconductor device 10 of the third embodiment, the inner wall portions 16f2 on the long sides of the case 15 (frame portion 16) of the semiconductor device 10 of the first embodiment are further provided with a low expansion member 38 via a buffer member 39. The low expansion member 38 has a flat plate shape and is arranged vertically downward (up to the front surface of the heat radiating plate 14) from the front (top) surface (upper opening 16a) of the frame portion 16. That is, each low expansion member 38 covers the entire surface of the inner wall portion 16/2 on each long side shown in FIG. 13. The low expansion members 18 and 38 provided on the inner wall portions 16/1 and 16/2 of the case 15 (frame portion 16) may be separately provided, as shown in FIG. 13, or integrally molded together.

The semiconductor device 10 including the low expansion member 38 can also be manufactured by the same manufacturing method as in the first embodiment. In step S4 of FIG. 3, when the low expansion members 18 and 38 are attached to the inner wall portions 16/1, 16/2, the buffer members 19 and 39 may be first arranged on the inner wall portions 16/1, 16/2 (and the external connection terminal 17), respectively. Alternatively, the buffer members 19 and 39 may be provided on the low expansion members 18 and 38, respectively, on the side of the inner wall portions 16/1 and 16/2, respectively.

The semiconductor device 10 of the third embodiment is provided with the low expansion member 38 with respect to the inner wall portions 16/2 on the long sides of the case 15 (frame portion 16) of the semiconductor device 10 of the first embodiment. But the present invention is not limited to this; the low expansion member 38 may be provided to the inner wall portions 16/2 on the long sides of the case 15 (frame portion 16) of the semiconductor device 10 of the second embodiment via the buffer member 39, for example.

By providing the low expansion members 18 and 38 on the inner wall portions 16/1 and 16/2 on the short sides and the long sides of the case 15 (frame portion 16) of the semiconductor device 10 in this way, pressing/pulling of the sealing member 21 due to expansion/contraction the frame portion 16 caused by temperature changes can be suppressed more reliably. Therefore, in the semiconductor device 10 including the low expansion members 18 and 38, the reliability against temperature changes can be further improved as compared with the case where only the low expansion members 18 are provided.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
a semiconductor chip;
a case having a frame portion that has an inner wall portion surrounding a housing area in which the semiconductor chip is disposed;
a buffer member provided on at least part of the inner wall portion of the case on a side of the housing area;
a low expansion member provided on the buffer member that is on said at least part of the inner wall portion of the case; and
a sealing member that seals the housing area so as to be in in contact with the low expansion member,
wherein the buffer member has a smaller elastic modulus than the case and the sealing member, and
wherein the low expansion member has a smaller linear expansion coefficient than the case and the sealing member.

2. The semiconductor device according to claim 1, wherein the buffer member joins said at least part of the inner wall portion and the low expansion member.

3. The semiconductor device according to claim 1, wherein the linear expansion coefficient of the low expansion member is $5\times10^{-6}$/K or more and less than $25\times10^{-6}$/K.

4. The semiconductor device according to claim 1, wherein the elastic modulus of the buffer member is 0.1 MPa or more and 1 GPa or less.

5. The semiconductor device according to claim 1, wherein the low expansion member and the sealing member are respectively epoxy resins containing a filler.

6. The semiconductor device according to claim 1, wherein the buffer member contains silicone rubber as a main component.

7. The semiconductor device according to claim 1, wherein the case is mainly composed of a polyphenylene sulfide (PPS) resin containing a filler.

8. The semiconductor device according to claim 1,
wherein the housing area has a rectangular shape in a plan view, and
wherein said at least part of the inner wall portion of the case on which the buffer member and the low expansion member are provided is located at a short side of the rectangular shape of the housing area.

9. The semiconductor device according to claim 8, wherein said at least part of the inner wall portion of the case on which the buffer member and the low expansion member are provided is located at a long side of the housing area as well as the short side of the rectangular shape of the housing area.

10. The semiconductor device according to claim 1, further comprising an external connection terminal that is provided on the inner wall portion of the case, the external connection terminal having one end electrically connected to the semiconductor chip, and another end that is located outside the case.

11. The semiconductor device according to claim 10, wherein a groove accommodating the external connection terminal is formed in the inner wall portion of the case where the external connection terminal is provided.

12. The semiconductor device according to claim 10, wherein the external connection terminal includes a horizontal portion including said one end of the external connection terminal and a vertical portion extending vertically from the horizontal portion and including said another end of the external connection terminal, thereby having an L-shaped cross section.

13. The semiconductor device according to claim 12, wherein the low expansion member covers at least a portion of the vertical portion of the external connection terminal.

14. The semiconductor device according to claim 13,
wherein said one end of the external connection terminal includes a bonding region to which a wiring member electrically connected to the semiconductor chip is joined, and
wherein the low expansion member exposes at least the bonding region and covers the horizontal portion of the external connection terminal.

15. The semiconductor device according to claim 14, wherein the low expansion member has an opening that exposes the bonding region of the external connection terminal.

16. The semiconductor device according to claim 11, wherein the low expansion member has a groove portion accommodating the external connection terminal on a back surface of the low expansion member, and the low expansion member is attached on the inner wall portion of the case with the external connection terminal fitted into the groove portion thereof.

\* \* \* \* \*